US008090812B2

(12) United States Patent
Nishiura et al.

(10) Patent No.: US 8,090,812 B2
(45) Date of Patent: Jan. 3, 2012

(54) CAE ANALYSIS PROGRESS MANAGEMENT SYSTEM

(75) Inventors: Hirokazu Nishiura, Kyoto (JP); Taiji Nemoto, Kyoto (JP); Jun Ando, Kyoto (JP); Norikazu Matsuura, Saitama (JP); Tomoaki Utsunomiya, Saitama (JP)

(73) Assignees: Integral Technology Co., Ltd., Osaka (JP); Honda Motor Co., Ltd., Tokyo (JP)

( * ) Notice: Subject to any disclaimer, the term of this patent is extended or adjusted under 35 U.S.C. 154(b) by 836 days.

(21) Appl. No.: 11/659,236

(22) PCT Filed: Jul. 20, 2005

(86) PCT No.: PCT/JP2005/013277
§ 371 (c)(1),
(2), (4) Date: Feb. 2, 2007

(87) PCT Pub. No.: WO2006/013721
PCT Pub. Date: Feb. 9, 2006

(65) Prior Publication Data
US 2007/0244733 A1    Oct. 18, 2007

(30) Foreign Application Priority Data
Aug. 4, 2004    (JP) ................. 2004-228330

(51) Int. Cl.
*G06F 15/173*    (2006.01)

(52) U.S. Cl. .......... 709/223; 709/224; 718/100
(58) Field of Classification Search .......... 709/223–224; 718/100
See application file for complete search history.

(56) References Cited

U.S. PATENT DOCUMENTS

| 5,862,333 | A | * | 1/1999 | Graf | 709/223 |
| 5,893,083 | A | * | 4/1999 | Eshghi et al. | 706/45 |
| 5,961,557 | A | * | 10/1999 | Morimoto et al. | 701/1 |

(Continued)

FOREIGN PATENT DOCUMENTS

JP    08-016639    1/1996

(Continued)

OTHER PUBLICATIONS

Nikkei Digital Engineering, vol. 26 (Jan. 15, 2000), p. 70-85, (Nikkei Business Publications, Inc.).

(Continued)

*Primary Examiner* — Mohamed Ibrahim
(74) *Attorney, Agent, or Firm* — Cheng Law Group, PLLC

(57) ABSTRACT

Progress management of analysis task is performed in CAE analysis. A system is provided in which a plurality of terminal apparatuses 10A, 10B and 10C storing an analysis procedure of CAE analysis as a program are connected to a management apparatus 20 managing a state of progress of CAE analysis via a communication network N. The management apparatus 20 generates progress management information in which an analysis task of CAE analysis is divided into a plurality of steps and transmits the progress management information to each of the terminal apparatuses 10A, 10B and 10C. Each of the terminal apparatuses 10A, 10B and 10C transmits to the management apparatus 20 progress state information of analysis task for one or a plurality of steps allocated to the terminal apparatus at a predetermined timing in accordance with the received progress management information. The management apparatus 20 uniformly manages a progress state of CAE analysis task performed by the terminal apparatuses 10A, 10B and 10C in association with each other by aggregating the progress state information transmitted from the terminal apparatuses 10A, 10B and 10C.

4 Claims, 18 Drawing Sheets

U.S. PATENT DOCUMENTS

| | | | |
|---|---|---|---|
| 6,026,394 A * | 2/2000 | Tsuchida et al. | 1/1 |
| 6,098,091 A * | 8/2000 | Kisor | 709/202 |
| 6,704,782 B1 * | 3/2004 | Achtermann et al. | 709/224 |
| 6,779,028 B1 * | 8/2004 | Nakamura | 709/223 |
| 7,188,343 B2 * | 3/2007 | Sanchez et al. | 718/100 |
| 7,363,359 B1 * | 4/2008 | Tripathy et al. | 709/223 |
| 2002/0065864 A1 * | 5/2002 | Hartsell et al. | 709/100 |
| 2003/0163215 A1 * | 8/2003 | Yoshioka | 700/97 |
| 2006/0103620 A1 * | 5/2006 | Joo et al. | 345/98 |

FOREIGN PATENT DOCUMENTS

| | | |
|---|---|---|
| JP | 2002-202997 | 7/2002 |
| JP | 2003-216686 | 7/2003 |
| JP | 2006-048364 | 2/2006 |

OTHER PUBLICATIONS

Nikkei Digital Engineering, vol. 26 (Jan. 15, 2000), p. 138-141, (Nikkei Business Publications, Inc.).

* cited by examiner

FIG.18

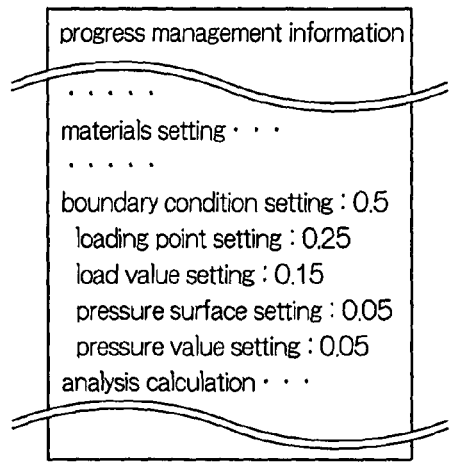

progress management information
・・・・・
materials setting ・・・
・・・・・
boundary condition setting : 0.5
　loading point setting : 0.25
　load value setting : 0.15
　pressure surface setting : 0.05
　pressure value setting : 0.05
analysis calculation ・・・

FIG.19

| 10A operator ⇒ | 20 manager |
|---|---|
| <task status> | <task progress state> |
| (1) start of boundary condition setting | · Model A analysis, operator's information, boundary condition start time [10:00], estimated man-hour [0.5], scheduled end time [10:30], number of sub-steps [4] |
| (2) start of loading point setting | · Model A analysis, operator's information, loading point setting start time [10:00], estimated man-hour [0.25], scheduled end time [10:15], step completion degree [0] |
| (3) end of loading point setting | · Model A analysis, operator's information, loading point setting end time [10:18], estimated man-hour [0.25], scheduled end time [10:15], difference from estimated man-hour [0.05], step completion degree [0.5] |
| (4) start of load value setting | · Model A analysis, operator's information, load value setting start time [10:18], estimated man-hour [0.15], scheduled end time [10:27], step completion degree [0.5] |
| (5) end of load value setting | · Model A analysis, operator's information, load value setting end time [10:24], estimated man-hour [0.15], scheduled end time [10:27], difference from estimated man-hour [0.0], step completion degree [0.8] |
| (6) start of pressure surface setting | · Model A analysis, operator's information, pressure surface setting start time [10:24], estimated man-hour [0.05], scheduled end time [10:27], step |
| (7) end of pressure surface setting | · Model A analysis, operator's information, pressure surface setting end time [10:27], estimated man-hour [0.05], scheduled end time [10:27], difference from estimated man-hour [0.0], step completion degree [0.9] |
| (8) start of pressure value setting | · Model A analysis, operator's information, pressure value setting start time [10:27], estimated man-hour [0.05], scheduled end time [10:30], step completion degree [0.9] |
| (9) end of pressure value setting | · Model A analysis, operator's information, pressure value setting end time [10:29], estimated man-hour [0.05], scheduled end time [10:30], difference from estimated man-hour [-0.016], step completion degree [1] |
| (10) start of boundary condition setting | · Model A analysis, operator's information, boundary condition end time [10:29], estimated man-hour [0.05], scheduled end time [10:30], difference from estimated man-hour [-0.016] or the like |

CAE ANALYSIS PROGRESS MANAGEMENT SYSTEM

TECHNICAL FIELD

The present invention relates to a progress management system of CAE (Computer Aided Engineering) analysis for use in the fields of computer simulation which can be used for evaluating product quality such as strength or rigidity of products, and computer simulation which aids design for improvement of drawing quality.

BACKGROUND ART

When CAE analysis technology is used to design various products, experts on the analysis conventionally perform complicated strength calculation or the like to design the products. Specifically, since CAE analysis is based on physical laws expressed with differential equations, the user needs to understand the differential equations and mathematical rules inevitably required for numerical analysis. Therefore, not everyone can easily perform CAE analysis.

The present applicant has already proposed a general-purpose analysis system which solves the above-described problems (see, for example, Patent Publication 1). The general-purpose analysis system stores a procedure of CAE analysis as a program, and comprises display means for displaying an analysis procedure screen for an object, general-purpose analysis procedure program storing means for storing a general-purpose analysis procedure program which is applied in common to various analysis objects, analysis know-how description screen display program storing means for storing a screen display program related to an analysis know-how description, the screen display program allowing the display means to display an analysis know-how description screen on which analysis know-how specific to an analysis object is described, analysis know-how storing means for storing analysis know-how on a specific object, the analysis know-how being described on the analysis know-how description screen, and analysis calculation means for executing analysis calculation with respect to a specific object based on the general-purpose analysis procedure program stored in the general-purpose analysis procedure program storing means and the analysis know-how on the specific object which is stored in the analysis know-how storing means. The general-purpose analysis procedure program includes at least a step of producing a mesh, a step of defining a material, and a step of setting a boundary condition. The analysis know-how description screen is linked to entry screens corresponding to the respective steps. Analysis know-how corresponding to each step for a specific object previously stored in the analysis know-how storing means is directly displayed on the analysis know-how description screen. According to the invention of Patent Publication 1, any one who is not an expert on analysis can easily and reliably perform CAE analysis.

However, a general-purpose analysis system disclosed in the above-described Patent Publication 1 is installed in an arbitrary terminal apparatus to operate in a self-contained manner in that terminal apparatus. For this reason, when a plurality of operators intend to share and perform an analysis task, it is required to establish a precise plan for the analysis in advance, and to notify all the operators of partial modifications to setting conditions (i.e. notification by fax or the like of data files or creation models, for example). Also, when an operator (beginner) in Tokyo performs the analysis, it causes much difficulties and troubles for the beginner who has only basic knowledge to ask questions regarding unclear points found during his/her analysis operation to other operator in Osaka (skilled operator). In addition, it is difficult also for the skilled operator to understand the problem that the beginner faces. Therefore, it has been very difficult to provide appropriate advice.

Accordingly, the present applicant has already proposed a general-purpose analysis system that has further solved the above-described problems. The general-purpose analysis system is a system structure in which a plurality of terminal apparatuses that store an analysis procedure of CAE analysis as a program are mutually connected via a communication network, and the terminal apparatuses perform the analysis procedure of CAE analysis with respect to a single analysis object simultaneously and in association with each other via the communication network in accordance with separate entries through the terminal apparatuses, with the system structure having a support function to provide mutual support for analysis tasks.

With such a structure, it is possible to share in real time a CAE analysis of the same analysis object by a plurality of terminal apparatuses, and provide a higher level of general versatility and a more flexible usable form of CAE analysis. Patent Publication 1: Japanese Patent No. 3382934

DISCLOSURE OF INVENTION

Problems to be Solved by the Invention

When a plurality of terminal apparatuses share in real time a CAE analysis of the same analysis object, it is necessary to manage to what extent the CAE analysis has proceeded on each terminal apparatus. Otherwise, if a situation occurs in which a certain terminal apparatus has already completed process of a portion of the analysis allocated thereto, while another terminal apparatus has not even started process of a portion of the analysis allocated thereto, the overall analysis process is significantly delayed. Therefore, in order to prevent such a delay in the analysis process, it is necessary to manage the state of progress of CAE analysis on each terminal apparatus. In addition, not only in the case in which a plurality of terminal apparatuses share a CAE analysis of the same analysis object, but also in the case in which one terminal apparatus performs a CAE analysis, it is important to understand the state of progress of CAE analysis, since it takes time. However, no conventional apparatus or system which performs progress management during such a CAE analysis process has been provided so far.

The present invention has been achieved to solve these problems, and has an object to provide a CAE analysis progress management system capable of performing progress management of analysis tasks during CAE analysis.

Means for Solving the Problems

The present invention provides a CAE analysis progress management system wherein a terminal apparatus storing an analysis procedure of CAE analysis as a program is connected to a management apparatus managing a state of progress of CAE analysis via a communication network, wherein progress management information in which an analysis task of CAE analysis is divided into a plurality of steps is generated, the terminal apparatus transmits to the management apparatus progress state information of analysis task of each step at a predetermined timing in accordance with the generated progress management information, and the management apparatus uniformly manages progress state of analysis task by aggregating the progress state information transmitted from the terminal apparatus.

The present invention provides a CAE analysis progress management system wherein a plurality of terminal apparatuses storing an analysis procedure of CAE analysis as a program are connected to a management apparatus managing a state of progress of CAE analysis via a communication network, wherein the terminal apparatuses are provided so as to be capable of performing an analysis task of CAE analysis with respect to a single analysis object in association with each other via the communication network, in accordance with separate entries through the terminal apparatuses, the management apparatus generates progress management information in which an analysis task of CAE analysis is divided into a plurality of steps and transmits the progress management information to each terminal apparatus, each terminal apparatus transmits to the management apparatus progress state information of analysis task for one or a plurality of steps allocated to the terminal apparatus at a predetermined timing in accordance with the received progress management information, and the management apparatus uniformly manages progress state of CAE analysis task performed by the terminal apparatuses in association with each other by aggregating the progress state information transmitted from the terminal apparatuses.

In the present invention, the progress management information contains an estimated man-hour, a progress confirmation step and manager's information for transmitting the progress state information to the management apparatus, and the terminal apparatus transmits the progress state information at a timing determined by the progress confirmation step.

According to a CAE analysis progress management system of the present invention configured as described above, a management apparatus generates progress management information to transmit the information to a terminal apparatus. The terminal apparatus, upon start of an analysis task, records task status such as task start date and time, user name of the operator and progress state of a step, and transmits progress state information of the analysis task of the step to the management apparatus at a predetermined timing in accordance with the received progress management information. In this manner, the terminal apparatus is configured such that a terminal apparatus transmits to a management apparatus the progress state of analysis tasks in accordance with progress management information generated by the management apparatus. As a result, the management apparatus can perform management of the progress state of CAE analysis tasks performed on the terminal apparatus (specifically, for example, to which step the currently-performed task has proceeded, or the man-hour required to finish that task).

Effects of the Invention

According to the present invention, the terminal apparatus is configured such that a terminal apparatus transmits to a management apparatus the progress state of analysis tasks in accordance with progress management information generated by the management apparatus. As a result, the management apparatus can perform total management of the progress state and man-hour of CAE analysis tasks performed on the terminal apparatus (specifically, for example, to which step the currently-performed task has proceeded, or the man-hour required to finish that task).

BRIEF DESCRIPTION OF DRAWINGS

FIG. 18 is a diagram for explaining an exemplary boundary condition setting step of the progress management information generated by a progress management information generation section of the management apparatus.

FIG. 19 is a diagram for specifically explaining a process for transmitting task status information from the terminal apparatus to the management apparatus at start and end timings of each step predetermined in accordance with the boundary condition setting step, which is a progress confirmation step of the progress management information.

Figure 1:
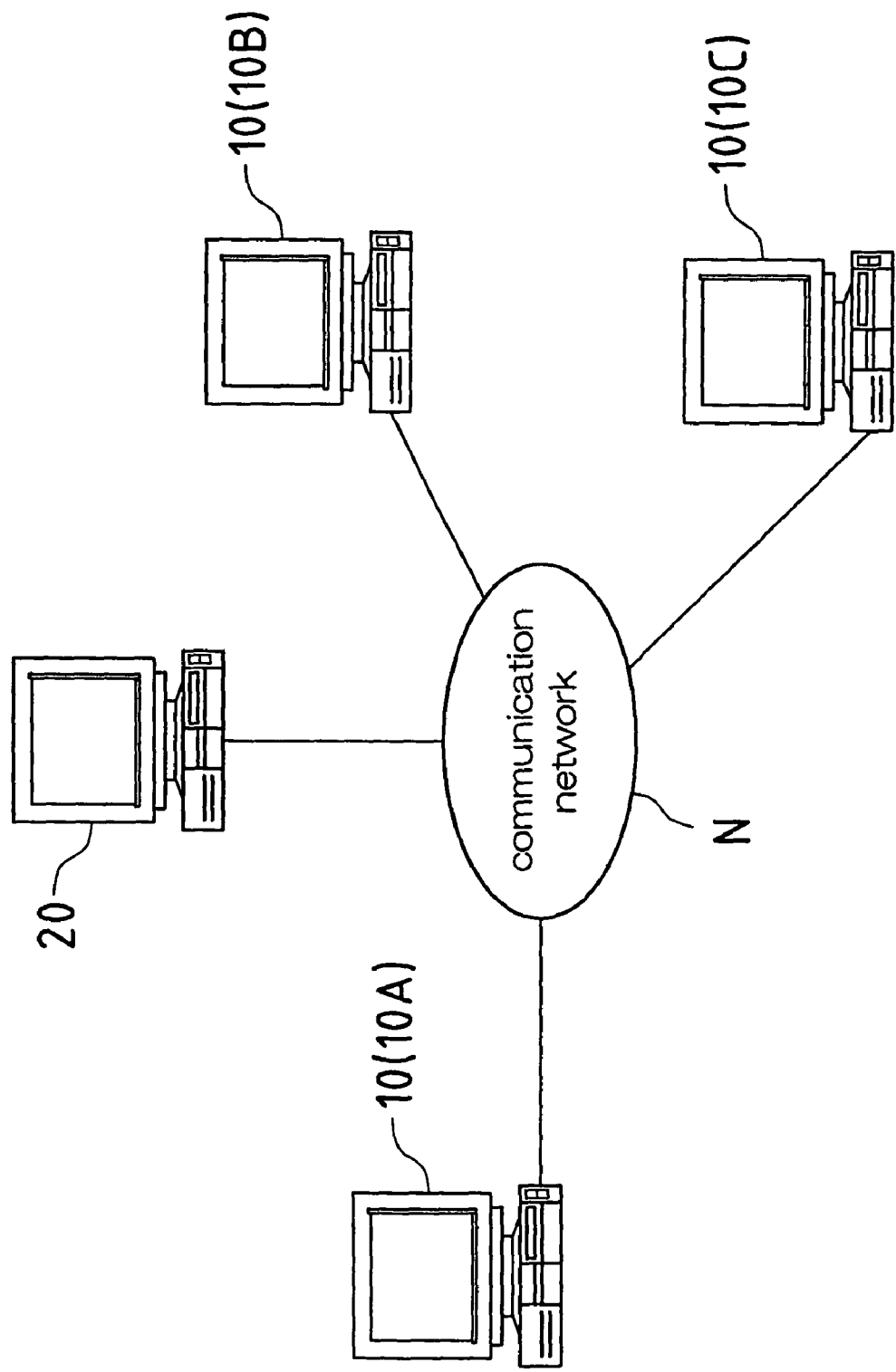
FIG. 1 is a schematic diagram illustrating a system structure of a CAE analysis navigation system according to an embodiment of the present invention.

DESCRIPTION OF REFERENCE NUMERALS 1 display section
2 entry section
3 screen display program storing section
4 analysis know-how storing section
5 analysis calculation processing section
6 prepost
61 computation section
62 analysis information file section
63 analysis result file section
7 network I/F
8 interactive control section
81 general-purpose analysis procedure file section
82 analysis know-how input/output section
9 progress management information storing section
10 (10A, 10B, 10C) terminal apparatuses
20 management apparatus
21 control section 22 progress management information generation section
23 progress management information storing section
24 progress state information storing section
25 progress state information aggregation section
27 network I/F
208 setting history screen (electronic notice board)
209 chat screen (electronic notice board)
N communication network

DESCRIPTION OF THE INVENTION

Hereinafter, embodiments of the present invention will be described with reference to the accompanying drawings.

FIG. 1 is a schematic diagram illustrating a system structure of a CAE analysis progress management system according to an embodiment of the present invention.

In the CAE analysis progress management system of the embodiment of the present invention, a plurality of terminal apparatuses 10 (10A, 10B, 10C, . . . ) which store an analysis procedure of CAE analysis as a program, and a management apparatus 20 that manages the state of progress of CAE analysis are connected to each other via a communication network N.

Figure 2:
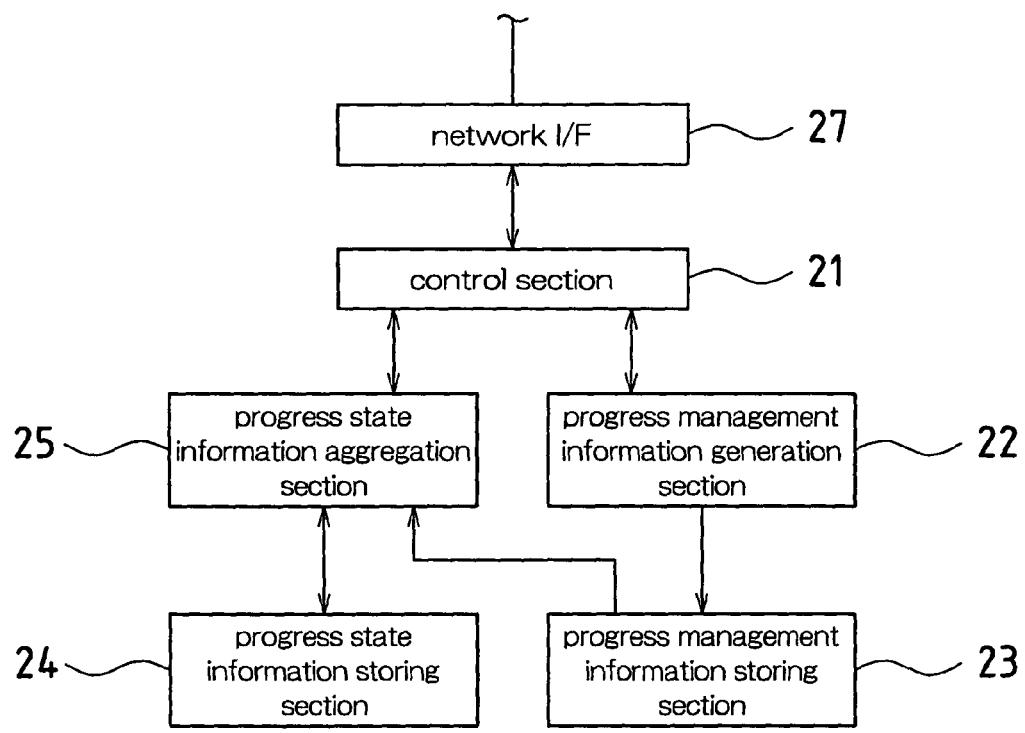
FIG. 2 is a block diagram conceptually illustrating an embodiment of a terminal apparatus in the CAE analysis navigation system of FIG. 1.

FIG. 2 is a block diagram conceptually illustrating an embodiment of the management apparatus 20 in the CAE analysis progress management system of FIG. 1.

The management apparatus 20 roughly comprises a control section 21 of controlling the entire management apparatus, a progress management information generation section 22 of generating progress management information in which a CAE analysis task is divided into a plurality of steps and transmitting the information to the terminal apparatuses 10, a progress confirmation information storing section 23 of storing the generated progress confirmation information, a progress state information storing section 24 of storing progress state information, a progress state information aggregation section 25 of storing the progress state information transmitted from each terminal apparatus 10 in the progress state information storing section 24 in association with the terminal apparatus 10, and aggregating the stored progress state information for uniform management, and a network interface (network I/F) 27 of reciprocally connecting to each terminal apparatus 10 via a communication network N.

Figure 3:
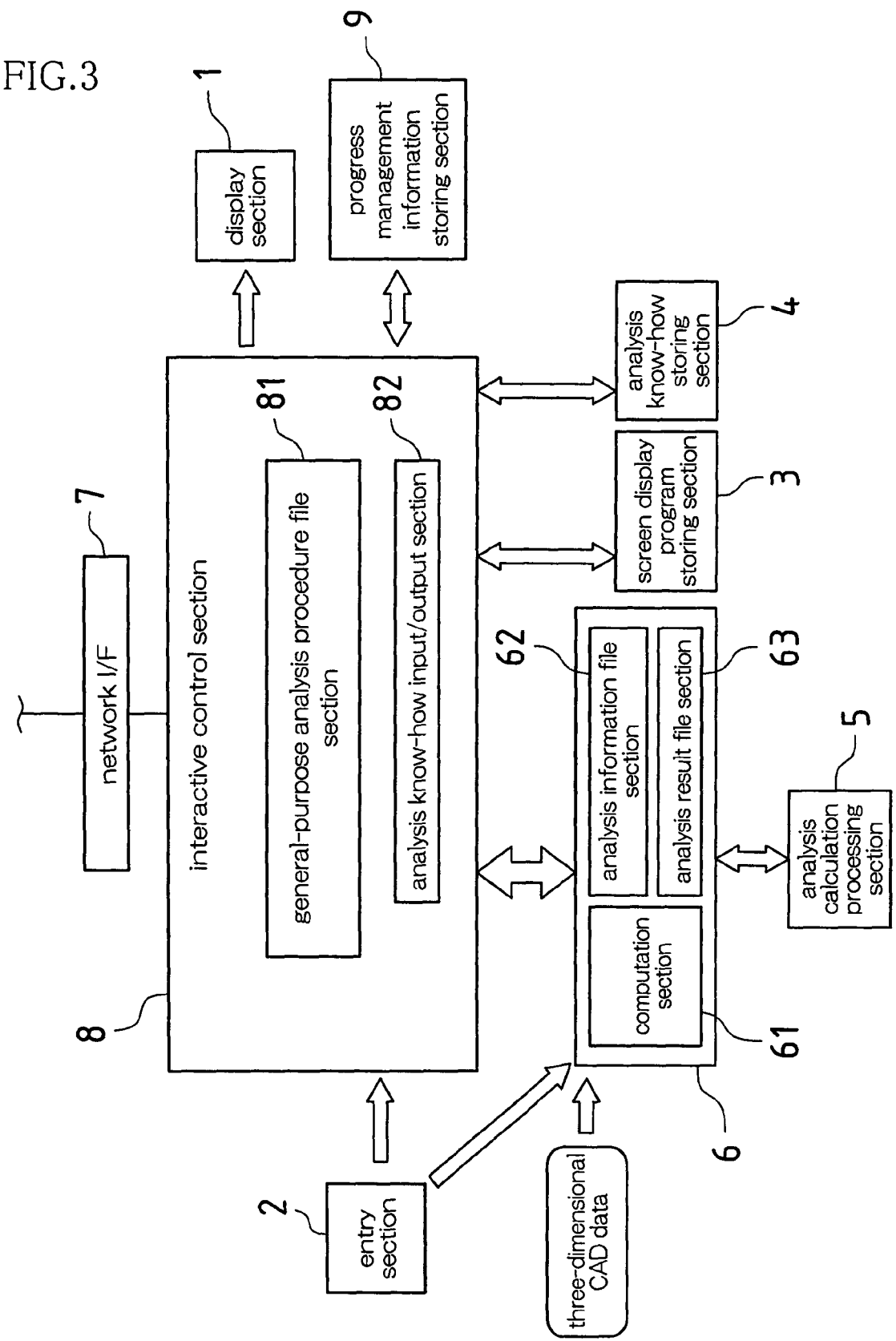
FIG. 3 is a diagram for explaining an exemplary basic arrangement of a model screen and a menu screen displayed on a display section.

FIG. 3 is a block diagram conceptually illustrating an embodiment of the terminal apparatus 10 in the CAE analysis progress management system of FIG. 1.

The terminal apparatus 10 roughly comprises: a display section 1 of displaying an analysis procedure screen or an analysis know-how screen for an object; an entry section 2 including a mouse, a keyboard, or the like which is used when operating any item on an analysis procedure screen displayed on the display section 1; a screen display program storing section 3 of storing an analysis procedure screen display program for successively displaying analysis procedure screens on the display section 1 in accordance with an operation of the entry section 2, and an analysis know-how screen display program for operating any item on each analysis procedure screen displayed on the display section 1 using the entry section 2 to display an analysis know-how screen corresponding to the item on the display section 1; an analysis know-how storing section 4 of storing analysis know-how of a specific object which is described on an analysis know-how screen displayed on the display section 1; an analysis calculation processing section (analysis solver) 5 of performing analysis in accordance with information input through the entry section 2; a progress management information storing section 9 of storing progress management information transmitted from the management apparatus 20; a prepost 6 and an interactive control section 8 which perform a control and a computation of each section; and a network interface (network I/F) 7 for reciprocally connecting to other terminal apparatus 10 via the communication network N.

The prepost 6 comprises a computation section 61, an analysis information file section 62, and an analysis result file section 63. The computation section 61 is a section which calculates element geometry or element division in actual analysis. The analysis information file section 62 is a section for accumulating information on an analysis object which is input on each entry screen through the entry section 2 or from three-dimensional CAD data. The analysis result file section 63 is a section which accumulates a result of analysis.

The interactive control section 8 comprises a general-purpose analysis procedure file section 81 which stores a general-purpose analysis procedure program which is applied in common to analysis objects, and an analysis know-how input/output section 82.

The analysis calculation processing section 5 performs analysis calculation with respect to a specific object based on the analysis information file section 62 of the prepost 6. Therefore, the analysis calculation processing section 5 is equipped with various analysis software (not shown) called as analysis solvers which perform analysis of an object (e.g., software for structural analysis, heat conduction analysis, flow analysis, magnetic field analysis, impact analysis, vibration analysis, etc.).

The interactive control section 8, when performing analysis, performs a process of successively displaying analysis information entry screens on the display section 1 in accordance with a program stored in the screen display program storing section 3, and accumulates analysis information input on the entry screens into the analysis information file section 62 of the prepost 6. The interactive control section 8 also accumulates into the analysis result file section 63 a result of analysis of an object which is performed by the analysis calculation processing section 5 based on analysis information stored in the analysis information file section 62. Note that the analysis know-how screen is not a major part of the present invention and will not be explained.

The interactive control sections 8 perform the analysis procedure of CAE analysis simultaneously and in association with each other via the communication network N and the network I/F 7, with respect to a single analysis object, based on inputs separately obtained through the entry sections 2 of the respective terminal apparatuses 10, and have a support function to reciprocally support the analysis task. The support function includes at least one piece of information among audio information, character information, and image information including a moving image. For example, an electronic notice board which provides character information is utilized as the support function.

In the above-described embodiment, the general-purpose analysis procedure file section 81 which stores a general-purpose analysis procedure program which is applied in common to various analysis objects, is stored in the interactive control section 8. Alternatively, the general-purpose analysis procedure file section 81 may be stored in a progress management information storing section 9 which is provided on and is connected to the communication network N. In this case, when performing analysis, each terminal apparatus 10 connects to the progress management information storing section 9 and installs the general-purpose analysis procedure program. After performing analysis, the general-purpose analysis procedure program is uninstalled as required.

Figure 4:
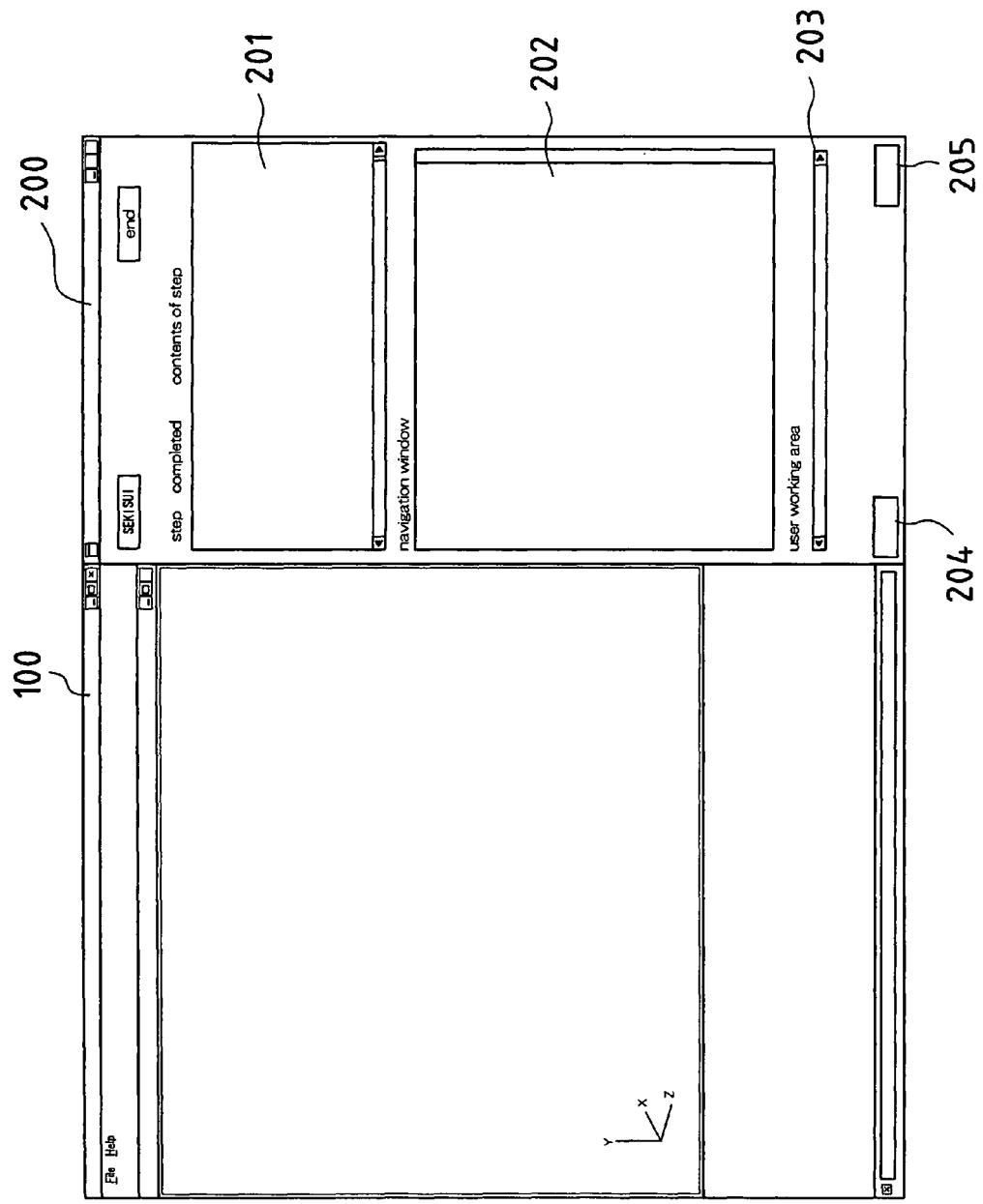
FIG. 4 is a diagram for explaining an exemplary initial screen when a database is opened.

FIG. 4 illustrates an exemplary basic arrangement of a model screen 100 which displays geometry models of analysis objects successively displayed on the display section 1 in accordance with the entry screen display program stored in the screen display program storing section 3, in accordance with an input operation through the entry section 2, and a menu screen 200 which displays an analysis procedure. Basically, various menu screens 200 are provided on a right-hand side of the model screen 100.

The menu screen 200 is basically composed of three parts. The upper part is a step display window 201 for displaying to what stage an operation of an analysis procedure has proceeded. The middle part is a display window (navigation window) 202 for displaying contents of the analysis procedure. The lower part is an entry window 203 for entering various numerical values, characters, or the like.

Here, the general-purpose analysis procedure program starts with a step of opening a database, and includes steps (procedure), i.e., a geometry producing step, a mesh refining step, a material characteristic value setting step, a condition setting step depending on analysis contents, an analysis performing step, and a result displaying step. In the embodiment, a plurality of the terminal apparatuses 10A, 10B, and 10C can be connected to each other via the communication network N. Therefore, the general-purpose analysis procedure program also includes an information transmitting step of transmitting processing information in each step to other terminal apparatuses to have in common the process in each step among the terminal apparatuses, an editing step of reflecting processing information transmitted from other terminal apparatuses in its own process, and a step of having in common support information for an analysis task corresponding to a process in each step among terminal apparatuses via, for example, an electronic notice board.

Next, a basic operation of CAE analysis performed by the CAE analysis progress management system thus constructed will be briefly described before a processing operation of CAE analysis will be described. Thereafter, the progress management, which is one of the features of the present invention, will be described.

<Description of Basic Operation of CAE Analysis>

Figure 5:
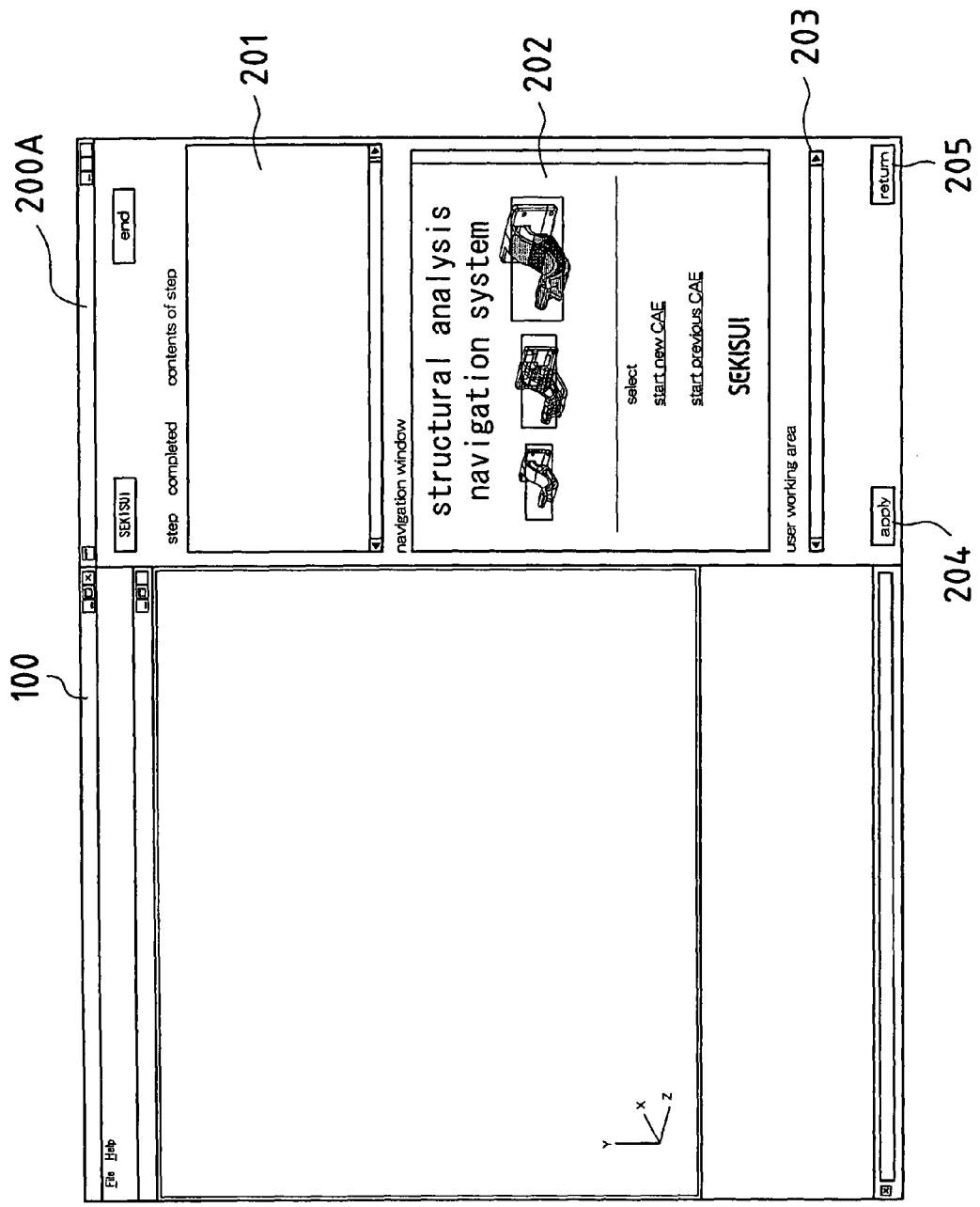
FIG. 5 is a diagram for explaining an exemplary analysis type selection screen.

Initially, the operator boots the apparatus, which in turn displays an initial screen 200A (FIG. 5) on the display section 1, and then selects either "start new CAE" or "resume previous CAE" in the navigation window 202. It is here assumed that "start new CAE" is selected. Note that, when "resume previous CAE" is selected, an existing modeling database which has already been analyzed is opened.

Figure 6:
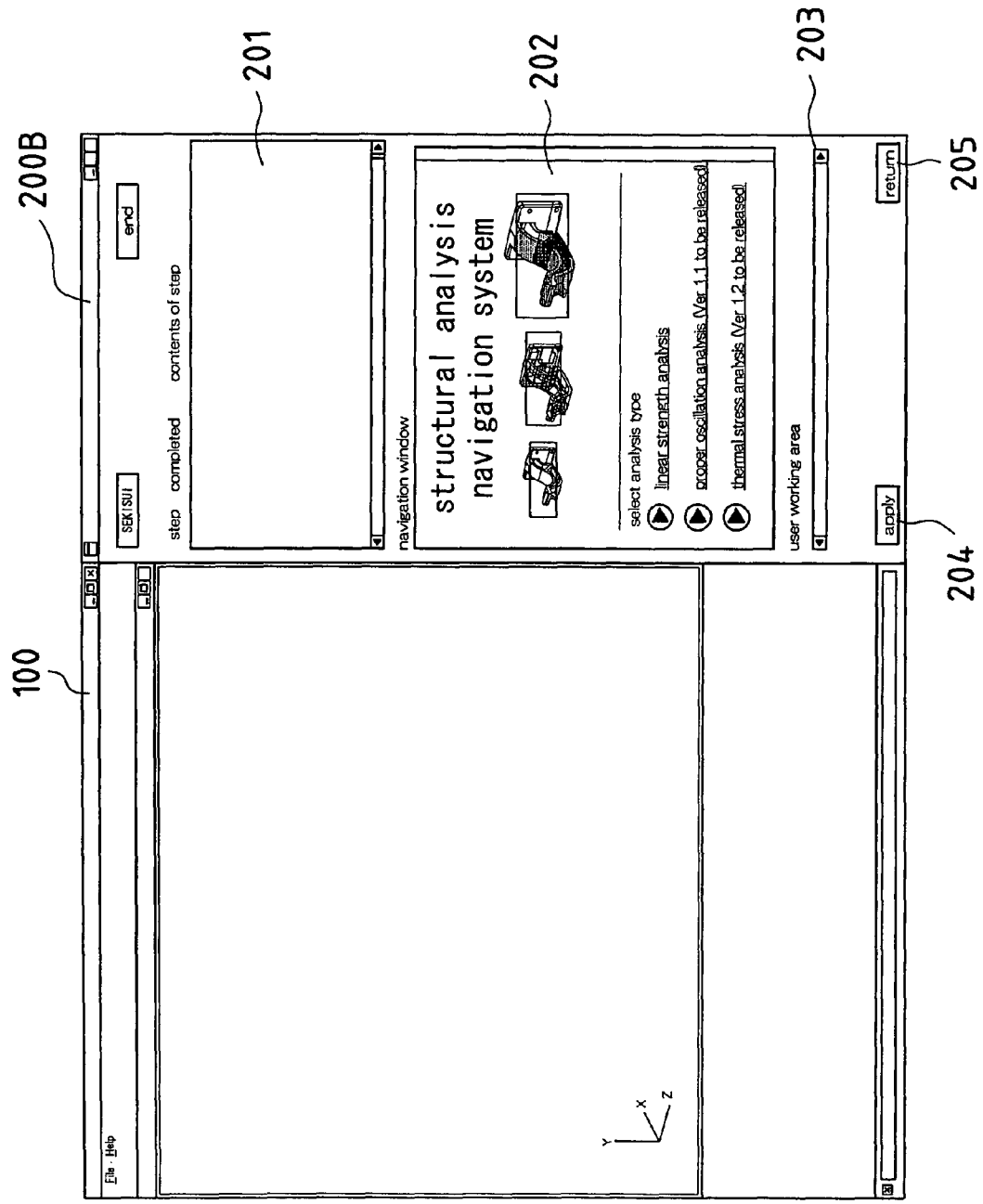
FIG. 6 is a diagram for explaining an exemplary case number entry screen of a boundary condition.

When "start new CAE" is selected, the interactive control section 8 activates the screen display program stored in the screen display program storing section 3 to display an analysis type selection screen 200B (FIG. 6) on the display section 1. The operator selects a type of analysis to be performed from contents displayed in the navigation window 202 on the analysis type selection screen 200B. Specifically, any of analysis types can be selected by shifting a cursor to an icon portion of a corresponding item displayed on the navigation window 202 and clicking the icon portion. It is here assumed that "linear strength analysis" is selected.

Figure 7:
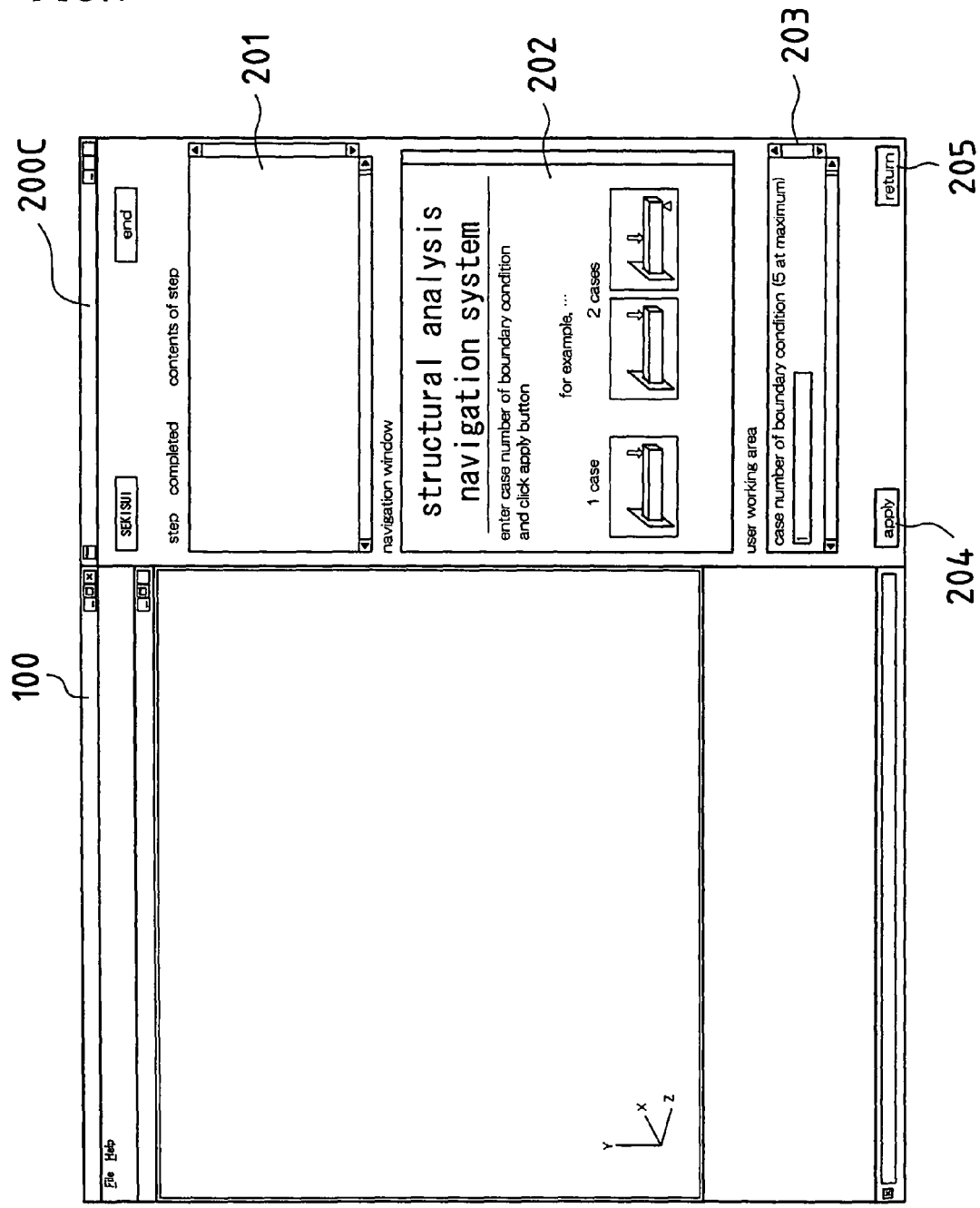
FIG. 7 is a diagram for explaining an exemplary analysis procedure display screen in the case of structural analysis.

Thereby, a case number entry screen 200C (FIG. 7) is displayed on the display section 1.

Figure 8:
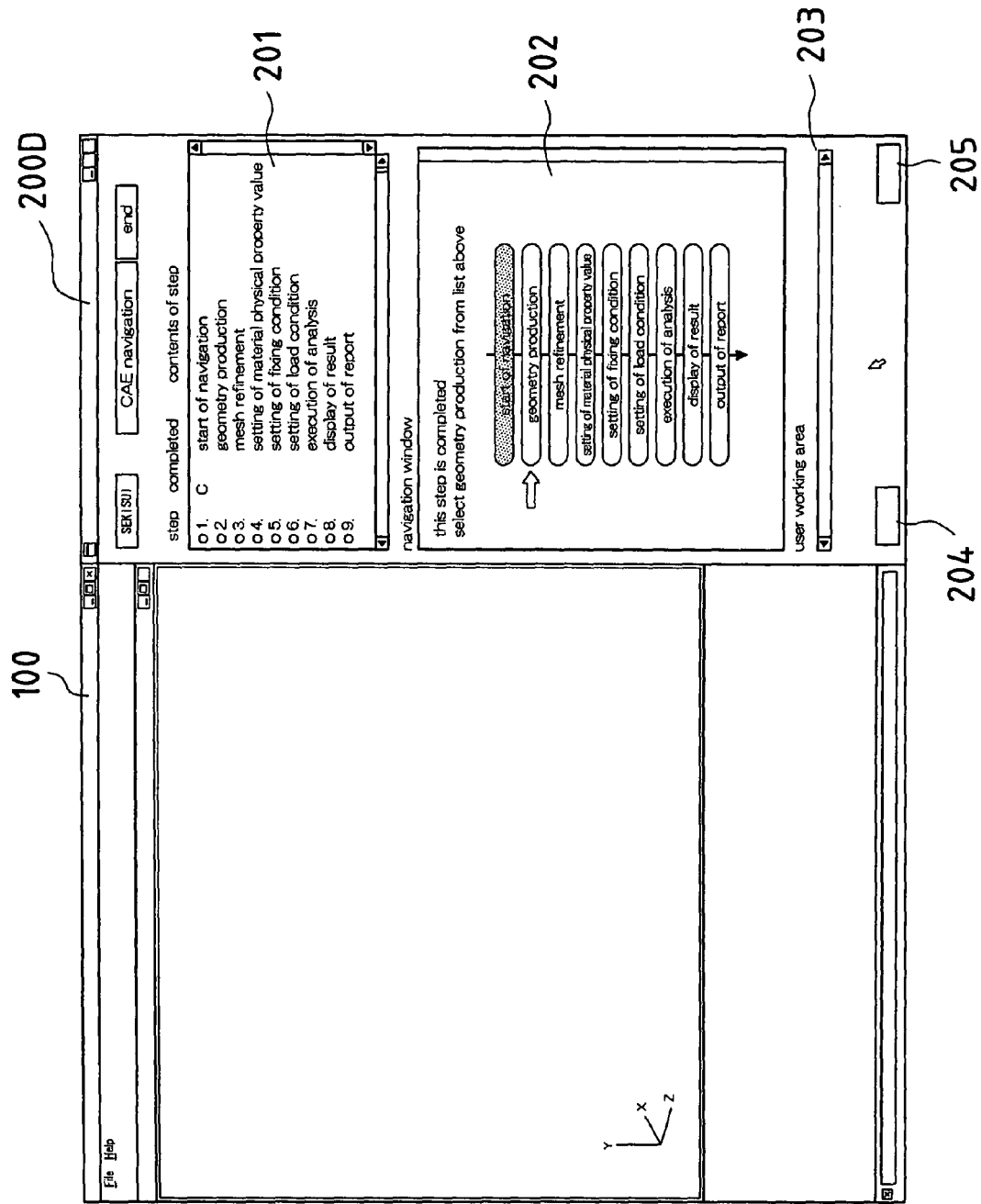
FIG. 8 is a diagram for explaining an exemplary analysis model selection screen.

Next, the operator enters the case number of a boundary condition into the selection entry window 203 of the case number entry screen 200C, and thereafter, clicks an apply button 204 using a mouse or the like to determine the case number of the boundary condition. As a result, the display section 1 displays an analysis procedure display screen 200D (FIG. 8). Note that FIG. 8 illustrates an analysis procedure of structural analysis.

Figure 9:
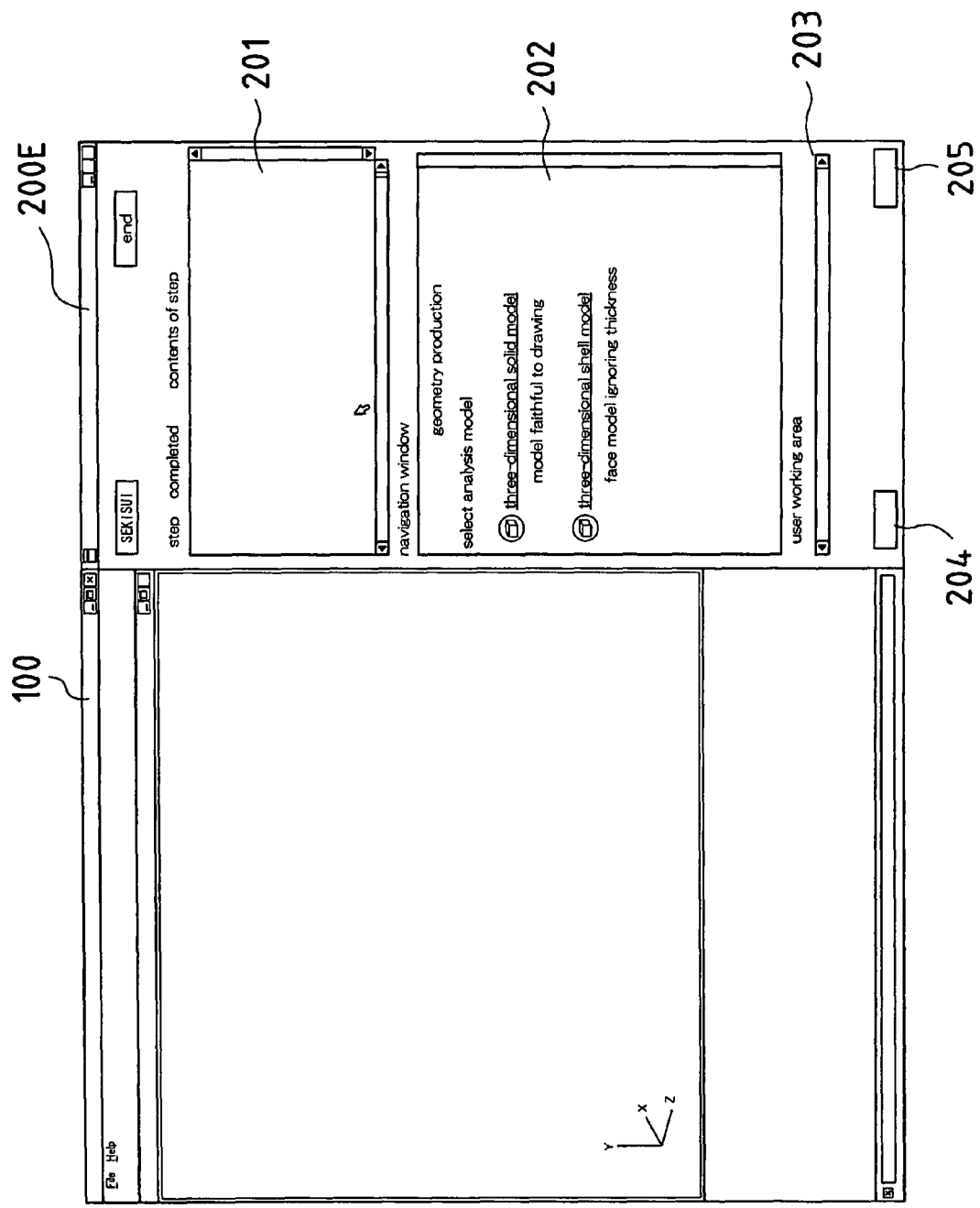
FIG. 9 is a diagram for explaining an exemplary geometry production screen.

The navigation window 202 displayed at this time of the analysis procedure display screen 200D displays contents which instruct to select a geometry producing step among the steps of the analysis procedure. Specifically, a step in the navigation which has been ended is indicated with an inverted color, and an arrow is provided on a side of the geometry producing step. When the operator clicks the geometry production in the step display window 201 using a mouse or the like in accordance with the instruction, an analysis model selection screen 200E (FIG. 9) is displayed on the display section 1.

Figure 10:
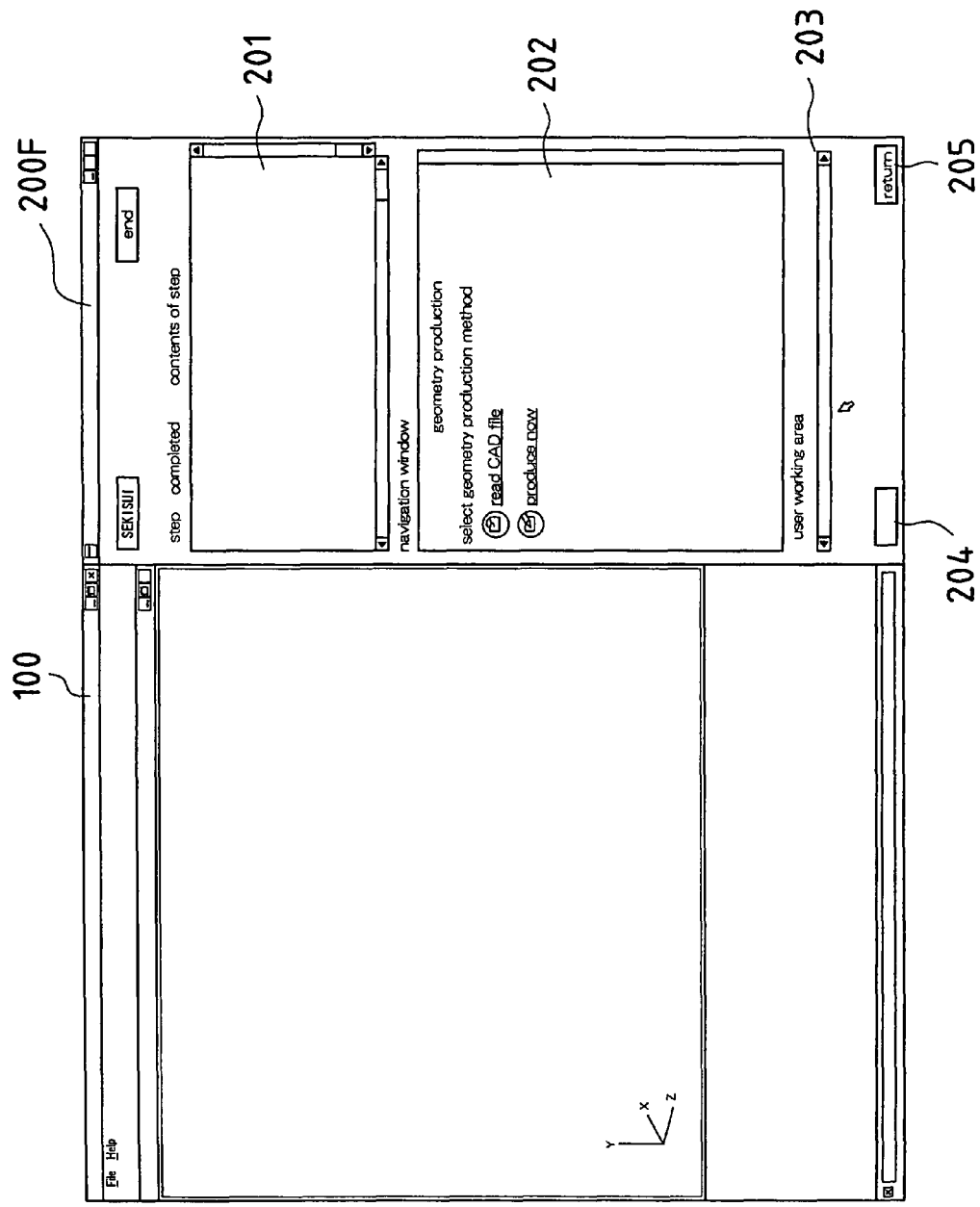
FIG. 10 is a diagram for explaining an exemplary CAD file selection screen.

Next, the operator selects one of two types of analysis models displayed on the navigation window 202 of the analysis model selection screen 200E. Specifically, an analysis model is selected by shifting a cursor to an icon portion displayed on a left-hand side of a corresponding item and clicking the icon portion using a mouse or the like. When it is here assumed that "three-dimensional shell model" is selected, a geometry production screen 200F (FIG. 10) is displayed on the display section 1.

Figure 11:
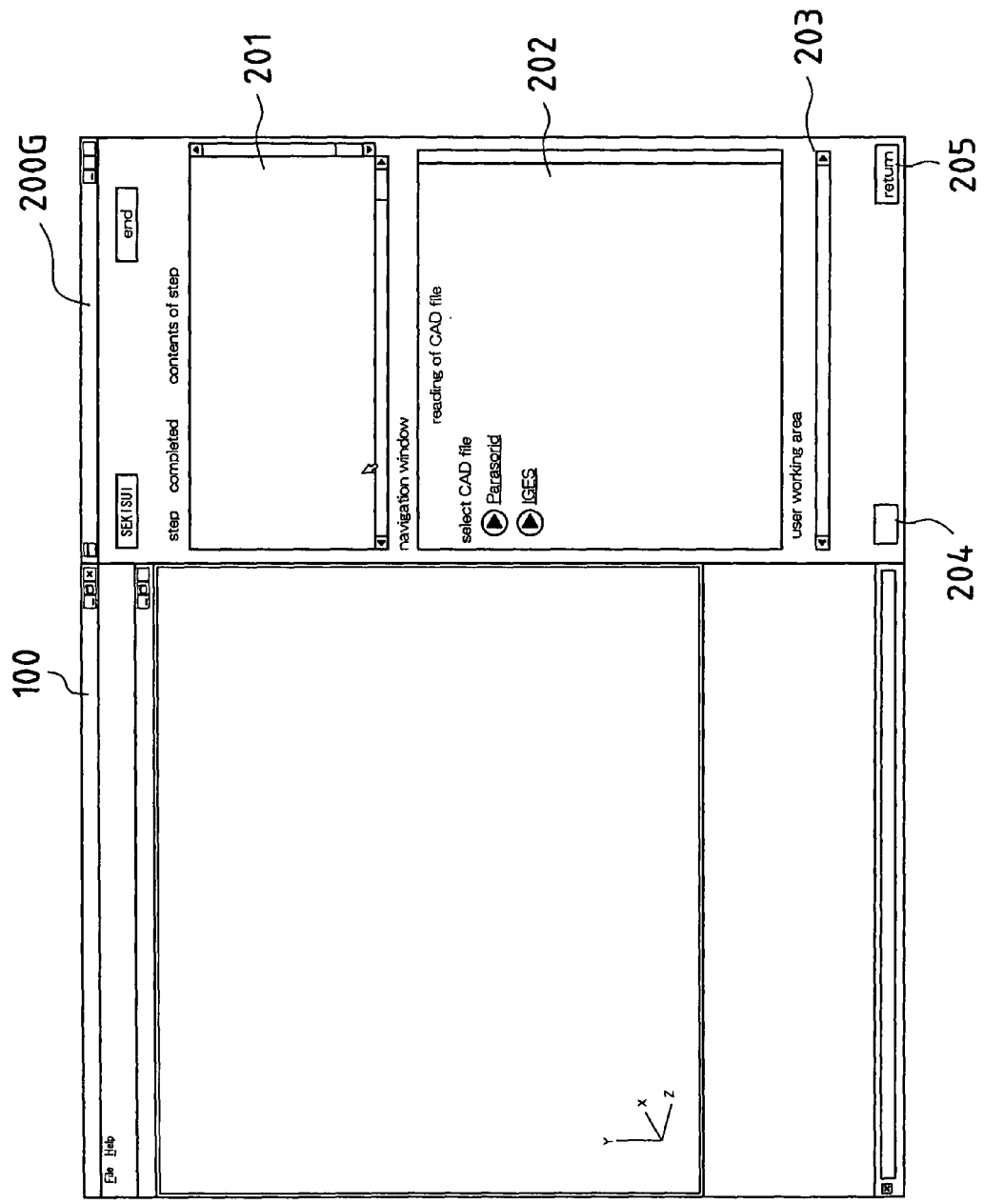
FIG. 11 is a diagram for explaining an exemplary CAD file selection screen.

Next, the operator selects one of two types of geometry producing methods which are displayed in the navigation window 202 of the geometry production screen 200F. Specifically, a geometry producing method is selected by shifting a cursor to an icon portion displayed on a left-hand side of a corresponding item and clicking the icon portion using a mouse or the like. When it is here assumed that "read CAD file" is selected, a CAD file selection screen 200G (FIG. 11) is displayed on the display section 1.

Figure 12:
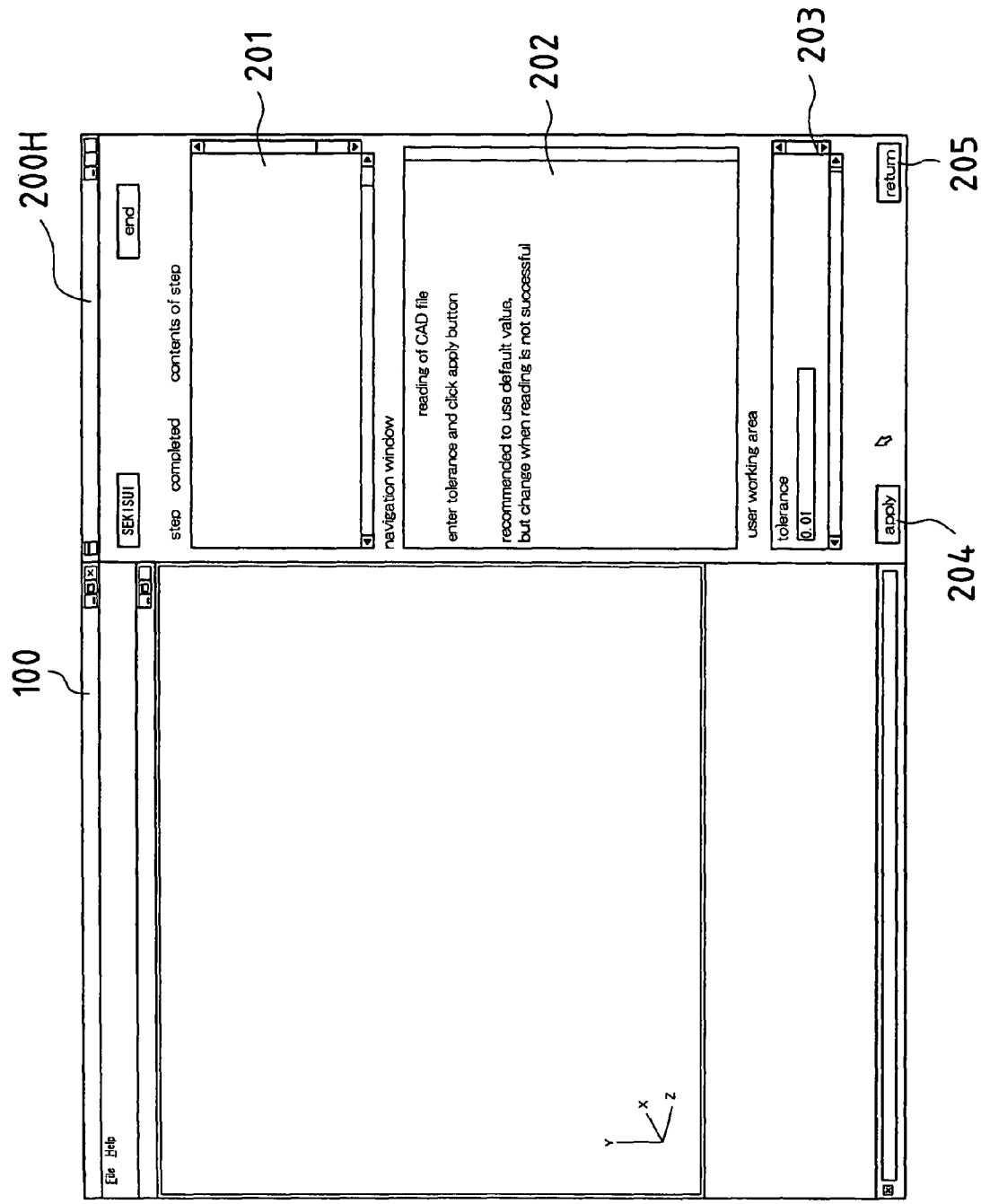
FIG. 12 is a diagram for explaining an exemplary CAD file selection screen.

Next, the operator selects one of two types of CAD files which are displayed on the navigation window 202 of the CAD file selection screen 200G. Specifically, a geometry producing method is selected by shifting a cursor to an icon portion displayed on a left-hand side of a corresponding item and clicking the icon portion using a mouse or the like. When it is here assumed that "IGES" is selected, a CAD file selection screen 200H (FIG. 12) is displayed on the display section 1.

Figure 13:
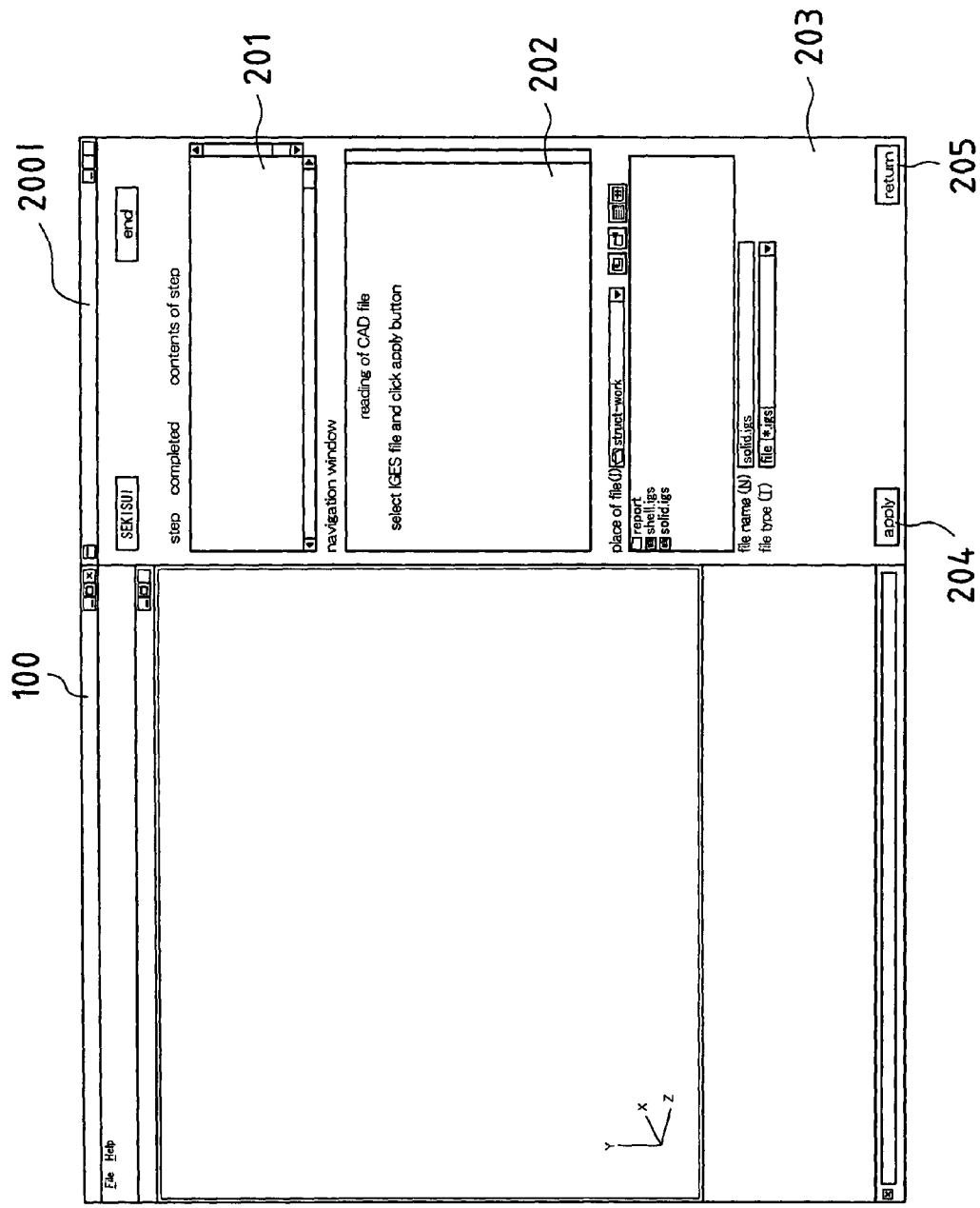
FIG. 13 is a diagram for explaining an exemplary model confirmation screen.

Next, the operator enters an tolerance into the entry window 203 in accordance with an instruction displayed on the navigation window 202 of the CAD file selection screen 200H, and then clicks the apply button 204 using a mouse or the like, so that a CAD file selection screen 200I (FIG. 13) is displayed on the display section 1.

Figure 14:
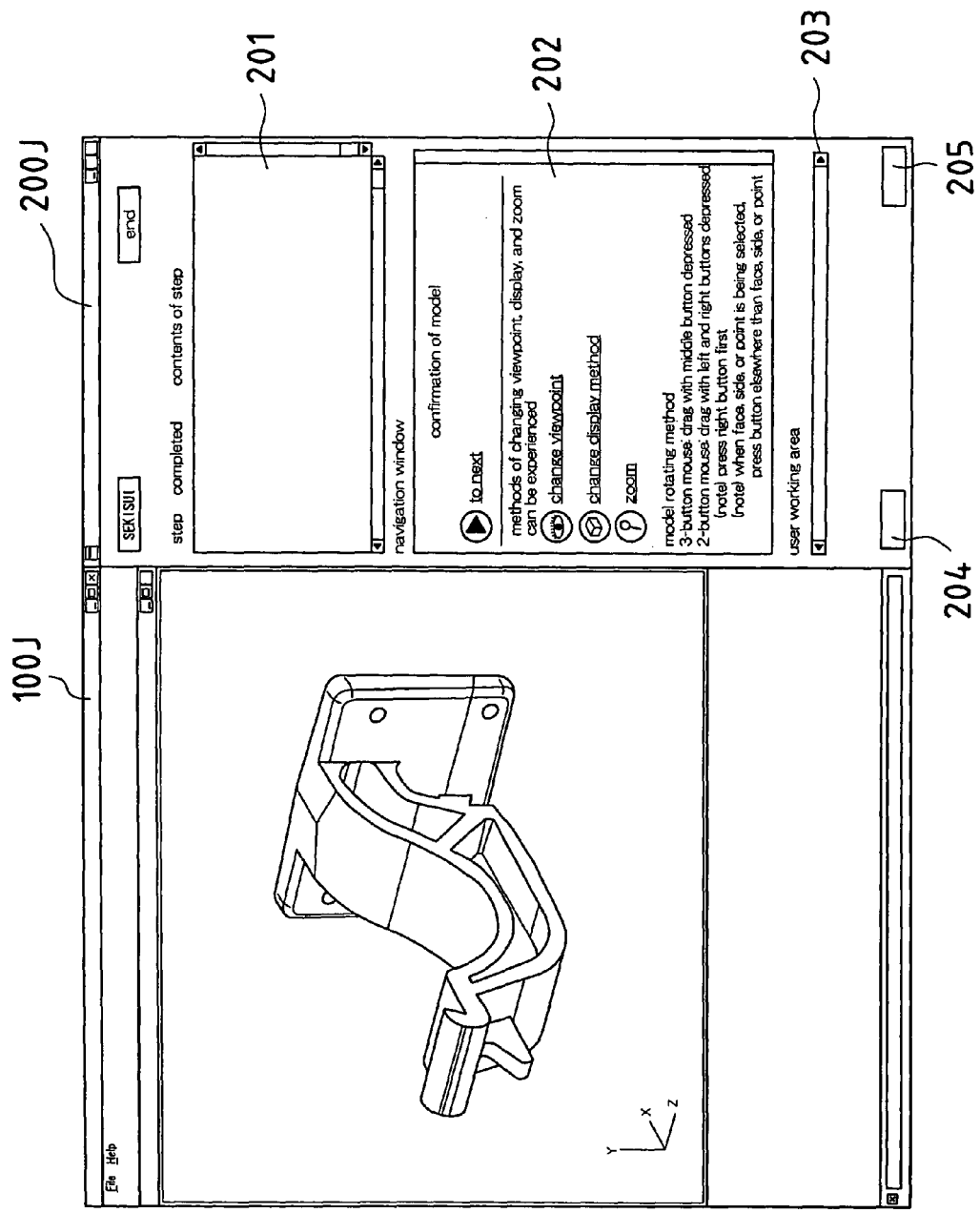
FIG. 14 is a diagram for explaining an exemplary analysis procedure display screen.

Next, the operator selects one of files displayed in an upper portion of the entry window 203 in accordance with an instruction displayed in the navigation window 202 of the CAD file selection screen 200I, and then clicks the apply button 204 using a mouse or the like, so that a model screen 100J and a model confirmation screen 200J for confirming a model geometry (FIG. 14) are displayed on the display section 1.

Figure 15:
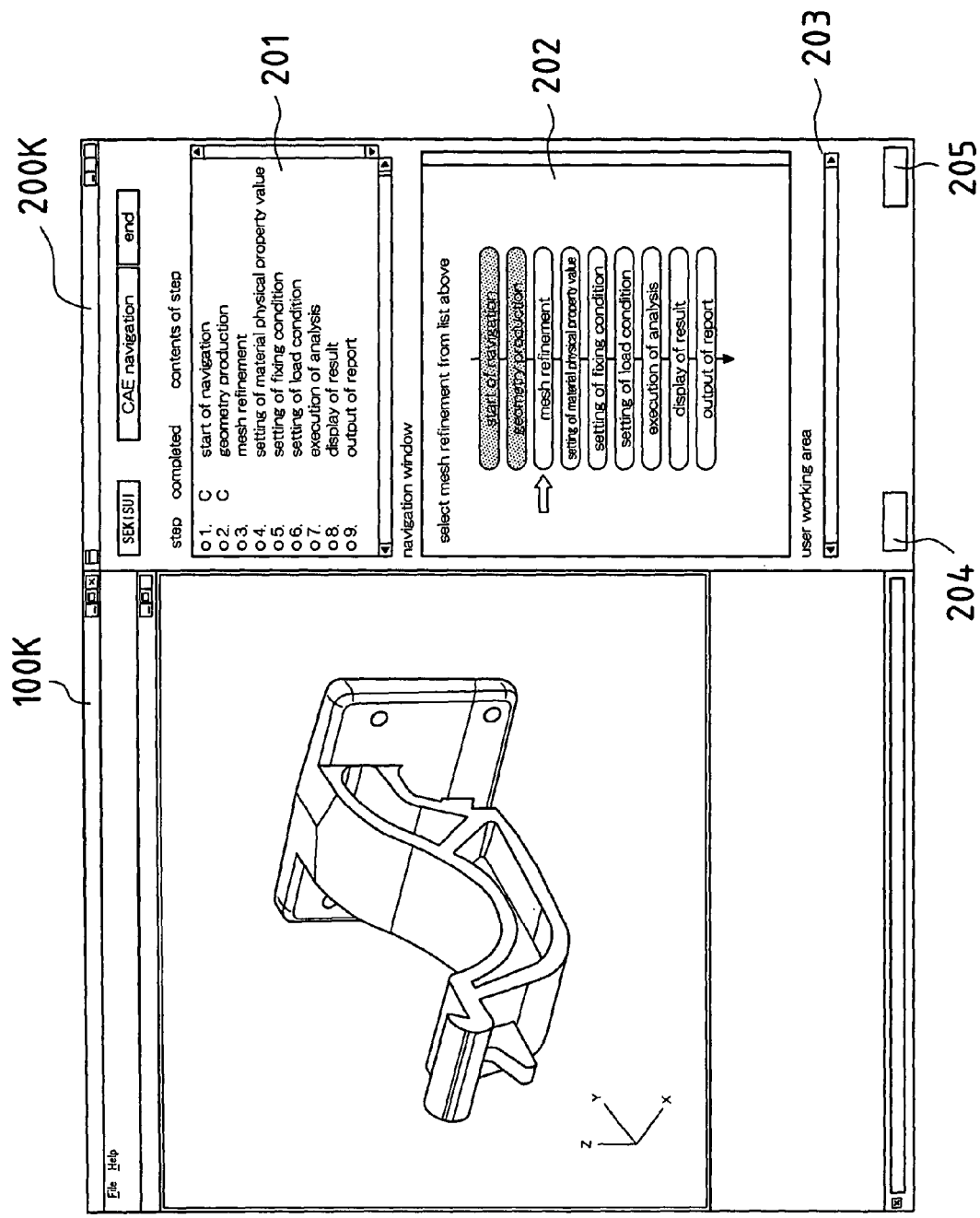
FIG. 15 is a diagram for explaining an exemplary mesh refinement screen.

Next, the operator visually confirms an analysis model (three-dimensional shell model) displayed on the model screen 100J while changing viewpoints, changing display methods, or zooming as required. Thereafter, the operator clicks an icon describing "to next" displayed on the navigation window 202, so that a model screen 100K and an analysis procedure display screen 200K (FIG. 15) are displayed on the display section 1.

The analysis procedure display screen 200K is the same as the analysis procedure display screen 200D of FIG. 8. However, in this case, the displayed contents of the navigation window 202 for displaying the steps of the analysis procedure indicate to select the next step, mesh refinement.

Figure 16:
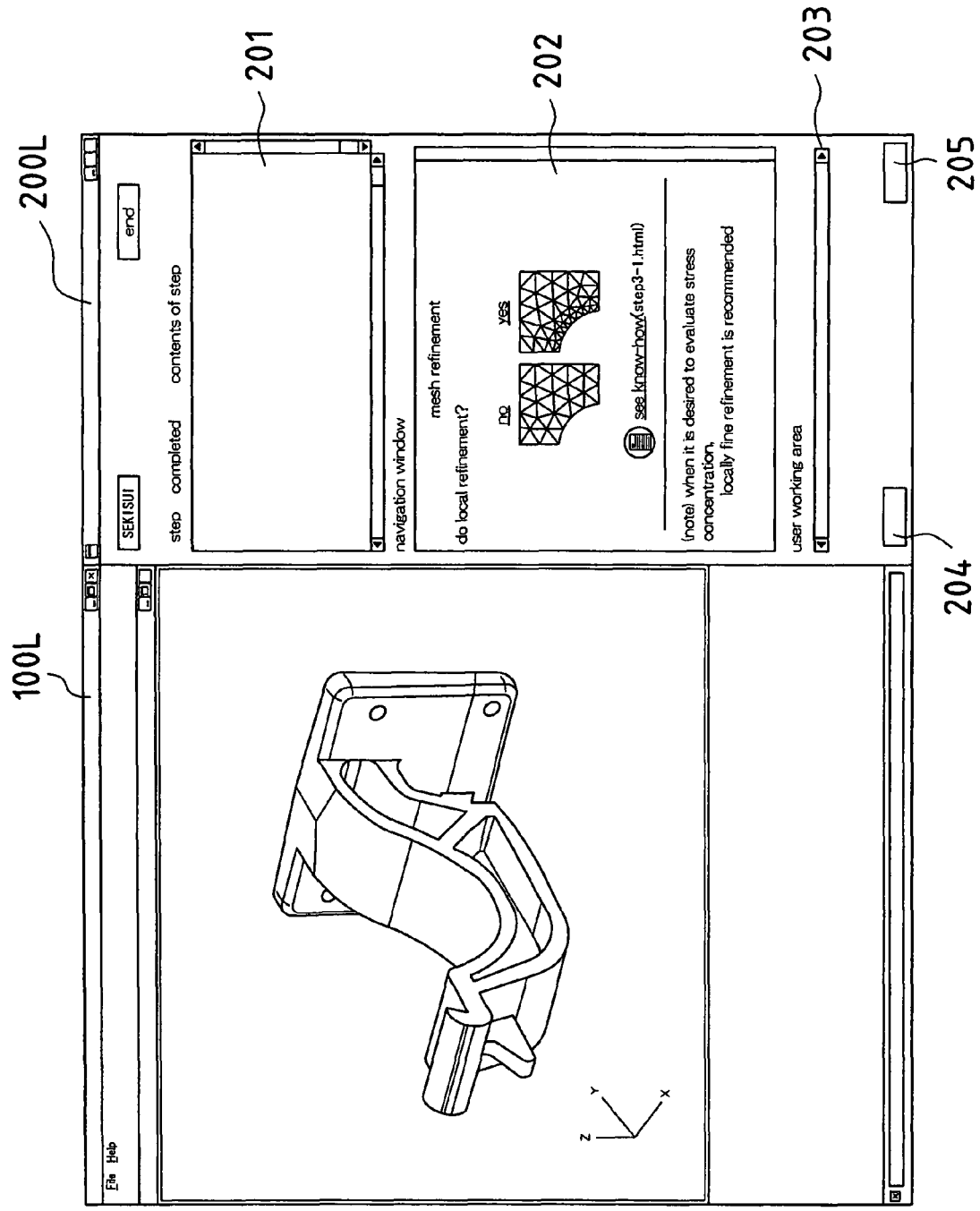
FIG. 16 is a diagram for explaining an exemplary screen for setting a fixing condition in a terminal apparatus.

FIG. 16 illustrates a model screen 100L and a mesh refinement confirmation screen 200L. The mesh refinement confirmation screen 200L includes the step display window 201 indicating to what stage entry has proceeded, the navigation window 202 in which the presence or absence of local refinement is confirmed in an interactive manner, and the entry window 203 which is a user working area.

The details of the subsequent portion of the analysis procedure will not be explained. Briefly, the operator performs the following steps in accordance with navigation instructions successively displayed on the menu screen 200: mesh refinement, material selection (determination of physical property values of material), setting of conditions corresponding to analysis contents (e.g., setting of a fixing condition and setting of a load condition in structural analysis; setting of a forming condition in flow analysis; setting of a boundary condition in heat analysis; etc.), and execution of analysis. These portions of the analysis procedure are disclosed in, for example, Patent Publication 1 and JP 2003-296371A which have already been filed by the present applicant.

The basic processing operation of the CAE analysis navigation system of the present invention has been heretofore described. Although, in the foregoing description, the model screen 100 and the menu screen 200 are displayed side by side on the display screen of the display section 1, the present invention has a certain degree of freedom with respect to such a display form. The analysis process can be shared and performed by a plurality of the terminal apparatuses 10. Hereinafter, a specific description will be given.

<Description of Exemplary Processing Operation of CAE Analysis of the Embodiment>

This example is characterized in that the above-described basic operation of CAE analysis is shared and performed by the terminal apparatuses 10A, 10B, and 10C of FIG. 1.

The CAE analysis processing program of the present invention is previously installed and the same model file is previously stored in each of the terminal apparatuses 10A, 10B, and 10C.

A situation is assumed for each terminal apparatus as follows: (a) the operator of the terminal apparatus 10A is the first to start an analysis task; (b) the operator of the terminal apparatus 10A is good at setting of conditions; (c) the operator of the terminal apparatus 10B is good at mesh refinement; and (d) the terminal apparatus 10C performs only a preprocess of CAE, but not analysis.

The procedure of CAE analysis of the present invention will be described in accordance with the above-described conditions.

(1) Start of Analysis Task

The operator of the terminal apparatus 10A boots the system, determines an analysis task name, and connects to the communication network N. Specifically, the operator registers the terminal apparatus 10A into a designated analysis task on the network.

On the other hand, the operators of the other terminal apparatuses 10B and 10C take part in the analysis task designated by the operator of the terminal apparatus 10A. Specifically, the operators register the respective terminal apparatuses 10B and 10C into the designated analysis task on the network.

(2) Reading of Analysis Model

The operator of the terminal apparatus 10A reads an analysis model. In this case, the terminal apparatus 10A transmits model read information to the other terminal apparatuses 10B and 10C registered in the designated analysis task.

The other terminal apparatuses 10B and 10C, which have received the model read information, read the same model as that which has been read by the terminal apparatus 10A.

(3) Edition of Analysis Condition

Next, the operator of the terminal apparatus 10A edits an analysis condition (e.g., a fixing condition and a load condition in structural analysis; a forming condition in flow analysis; a boundary condition in heat analysis; etc.), depending on the analysis contents. The terminal apparatus 10A transmits the analysis condition information thus set to the other terminal apparatuses 10B and 10C.

The other terminal apparatuses 10B and 10C, which have received the analysis condition information, edit the analysis condition set by the terminal apparatus 10A. Thereby, the condition set in the terminal apparatus 10A is also reflected on the terminal apparatuses 10B and 10C.

(4) Confirmation of Condition

The operator of each of the terminal apparatuses 10A, 10B, and 10C exchanges a message with the operators of the other terminal apparatuses to confirm the set analysis condition. Here, the message is transmitted and received between each terminal using a chat function.

(5) Start of Mesh Refinement

Mesh refinement is performed by the operator of the terminal apparatus 10B. Specifically, the operator of the terminal apparatus 10B informs the other terminal apparatuses 10A and 10C of start of mesh refinement.

After receiving the start information from the terminal apparatus 10B, the operators of the other terminal apparatuses 10A and 10C return acknowledgment information in response to the start information. Note that, when the operators of the other terminal apparatuses 10A and 10C do not perform mesh refinement, the operators of the other terminal apparatuses 10A and 10C inform the terminal apparatus 10B that mesh refinement is not performed, and withdraw from the joint task.

After receiving the acknowledgment information from the other terminal apparatuses 10A and 10C, the operator of the terminal apparatus 10B starts mesh refinement.

Also, the operators of the other terminal apparatuses 10A and 10C start mesh refinement in accordance with the condition set by the operator of the terminal apparatus 10B.

The operations of the terminal apparatuses 10A, 10B, and 10C are limited until the terminal apparatuses 10A, 10B, and 10C end the mesh refinement.

(6) End of Mesh Refinement

After ending the mesh refinement, each of the terminal apparatuses 10A, 10B, and 10C informs the other terminal apparatuses that it has ended the mesh refinement.

(7) Start of Analysis

After confirming the mesh refinement in each of the terminal apparatuses 10A, 10B, and 10C, the operator of the terminal apparatus 10B performs an analysis task. Specifically, the operator of the terminal apparatus 10B informs the other terminal apparatuses 10A and 10C of start of the analysis task.

After receiving the start information from the terminal apparatus 10B, the operators of the other terminal apparatuses 10A and 10C return acknowledgement information in response to the start information. Note that, when the operators of the other terminal apparatuses 10A and 10C do not perform the analysis task, the operators of the other terminal apparatuses 10A and 10C inform the terminal apparatus 10B that the analysis task is not performed, and withdraw from the joint task at this time. In this embodiment, the operator of the terminal apparatus 10C withdraws from the joint task at this time without performing the analysis task.

When receiving the acknowledgement information from the other terminal apparatuses 10A and 10C, the operator of the terminal apparatus 10B starts the analysis task. The operator of the other terminal apparatus 10A also starts the analysis task in accordance with the analysis condition set by the operator of the terminal apparatus 10B.

The operations of the terminal apparatuses 10A and 10B are limited until the terminal apparatuses 10A and 10B end the analysis task.

(8) End of Analysis

After ending the analysis task, each of the terminal apparatuses 10A and 10B informs the other apparatus that it has ended the analysis task.

(9) End of Analysis Task

After receiving the analysis task ending information, each of the operators of the terminal apparatuses 10A and 10B exchanges a message with the operator of the other terminal apparatus to confirm a result of the analysis, and thereafter, ends the allotted tasks, and withdraws from the joint task. Note that it is only the joint task on the network that is ended, and subsequent report production and the like are performed by the terminal apparatuses separately.

An exemplary processing operation of CAE analysis of the embodiment of the present invention has been heretofore described.

Next, processing operation of CAE analysis progress management, which is one of the features of the present invention, will be described in terms of two aspects, task status management and man-hour management.

<Description of Processing Operation of Task Status Management of CAE Analysis According to the Present Invention>

As described in the above exemplary processing operation of CAE analysis, for example, in mesh refinement, the operators of the terminal apparatuses 10A and 10C start mesh refinement in accordance with the condition set by the operator of the terminal apparatus 10B. The operations of the terminal apparatuses 10A, 10B and 10C are limited until all the terminal apparatuses 10A, 10B and 10C end the mesh refinement. Therefore, in the case in which the terminal apparatuses 10A and 10B have already ended the mesh refinement while the terminal apparatus 10C has not yet ended the mesh refinement, a situation occurs in which even though the terminal apparatuses 10A and 10B attempt to perform the next analysis process, they cannot perform the next process. In order to avoid such a situation as much as possible, it is necessary to understand the progress state of CAE analysis on the respective terminal apparatuses 10A, 10B and 10C for uniform management. A specific example of progress management is described below.

As shown in FIG. 3, the management apparatus 20 includes the progress management information generation section 21 and the progress state information aggregation section 22.

The progress management information generation section 21 generates progress management information in which various tasks of CAE analysis are respectively divided into a plurality of steps. The plurality of steps are not necessarily required to be in correspondence with the steps displayed on the step display window 201 of the menu screen 200 shown in FIG. 8 (a geometry producing step, a mesh refining step, a material physical property value setting step, a fixing condition setting step, a load condition setting step, an analysis performing step, a result displaying step, and a report outputting step) on a one-to-one basis. For example, the mesh refining step may be further divided into a plurality of steps. The manager can determine how to divide an analysis task into steps for the purpose of progress management, taking into account time required to perform analysis or the like, so as to make the progress management easier.

Here, the progress management information includes the estimated man-hour required for a task (estimated days required for a task), a progress confirmation step generated by the manager and a manager's address for transmitting progress state information to the management apparatus 20. The progress confirmation step is achieved by a progress confirmation program for performing a process concerning transmission of progress state of task steps to the management apparatus 20 and the timing of such transmission, for example.

Prior to starting a CAE analysis, the management apparatus 20 generates progress management information corresponding to the type of the CAE analysis with the progress management information generation section 21, stores the generated progress management information in the progress management information storing section 23, and transmits the same to the respective terminal apparatuses 10A, 10B and 10C, which perform the analysis.

The terminal apparatuses 10A, 10B and 10C store the received progress management information in the progress management information storing section 9. The terminal apparatuses 10A, 10B and 10C then transmits progress state information to the management apparatus 20 at a predetermined timing in accordance with the progress confirmation step of this received progress management information, upon execution of the CAE analysis.

Figure 17:
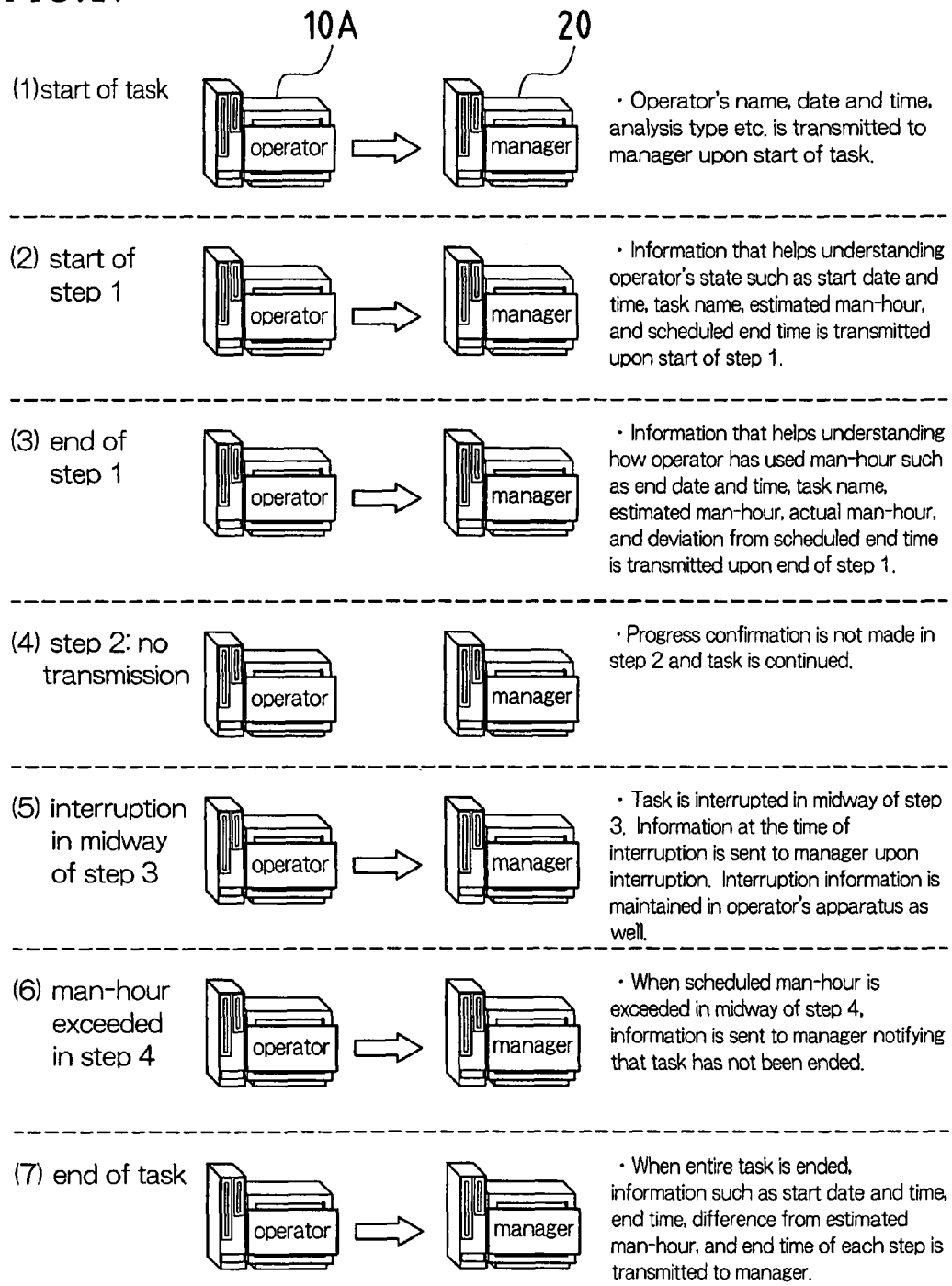
FIG. 17 is a diagram for illustrating on an image basis a transmission process for transmitting progress state information from the terminal apparatus to the management apparatus at a timing predetermined in accordance with a progress confirmation step of the progress management information.

FIG. 17 is a diagram for illustrating on an image basis a transmission process for transmitting progress state information at this time. In this diagram, a transmission process between one terminal apparatus (10A, for example) and the management apparatus 20 is taken as an example, showing types and timings of the progress confirmation that occurs when tasks of steps 1 through 4 are performed with the terminal apparatus 10A. Man-hour management and delivery management are possible in the present example, and man-hour management is carried out in the present example. In steps 1, 3 and 4, the progress confirmation step is configured to notify the start and end thereof, and in step 2, the progress confirmation step is configured to notify nothing. However, in FIG. 17, notification of the start and end of steps 3 and 4 is omitted.

(1) Start of Task

Upon starting a CAE analysis task, the terminal apparatus 10A transmits information such as the operator's name and date and time of the task, as well as analysis type to the management apparatus 20. The progress state information aggregation section 25 of the management apparatus 20 stores these pieces of information transmitted in the progress state information storing section 24 in association with the terminal apparatus 10A.

(2) Start of Step 1

At the start of step 1, the terminal apparatus 10A transmits information that helps understanding the state of the operator, such as the start date and time, task name, estimated man-hour, and scheduled end time. The progress state information aggregation section 25 of the management apparatus 20 stores these pieces of information transmitted in the progress state information storing section 24 in association with the terminal apparatus 10A.

(3) End of Step 1

At the end of step 1, the terminal apparatus 10A transmits information that helps understanding how the operator used man-hour, such as the end date and time, task name, estimated man-hour, actual man-hour, and deviation from the scheduled end time. The progress state information aggregation section 25 of the management apparatus 20 stores these pieces of information transmitted in the progress state information storing section 24 in association with the terminal apparatus 10A.

(4) Step 2: No Transmission

The progress confirmation step is set such that no transmission is made in step 2. Therefore, the task is preceded without progress confirmation.

(5) Interruption in Midway of Step 3

At the start of step 3, the terminal apparatus 10A transmits information that helps understanding the state of the operator, such as the start date and time, task name, estimated man-hour, and scheduled end time. The management apparatus 20 stores these pieces of information transmitted in the progress state information storing section 24 in association with the terminal apparatus 10A. Thereafter, when the task is interrupted in midway of step 3, the terminal apparatus 10A transmits the information at the time of interruption to the management apparatus 20. The progress state information aggregation section 25 of the management apparatus 20 stores the information at the time of interruption in the progress state information storing section 24 in association with the terminal apparatus 10A. The interruption information is stored in the terminal apparatus 10A as well.

(6) Step 4: Excessive Man-Hour

At the start of step 4, the terminal apparatus 10A transmits information that helps understanding the state of the operator, such as the start date and time, task name, estimated man-hour, and scheduled end time. The management apparatus 20 stores these pieces of information transmitted in the progress state information storing section 24 in association with the terminal apparatus 10A. Thereafter, when the estimated man-hour is exceeded in midway of step 4, the terminal apparatus 10A performs transmission to the management apparatus 20 to notify that the task has not ended. The progress state information aggregation section 25 of the management apparatus 20 stores this excessive man-hour information in the progress state information storing section 24 in association with the terminal apparatus 10A.

(7) End of Task

When the entire task is ended, the terminal apparatus 10A transmits information such as the start date and time and end time of the task, difference from the estimated man-hour, and end time of each step of the task to the management apparatus 20. The progress state information aggregation section 25 of the management apparatus 20 stores these pieces of information in the progress state information storing section 24 in association with the terminal apparatus 10A.

In the manner described above, each terminal apparatus 10 transmits the progress state of each step to the management apparatus 20 at a predetermined timing in accordance with the received progress confirmation step.

<Description of Processing Operation of Man-Hour Management of CAE Analysis According to the Present Invention>

Man-hour management in the boundary condition setting step is described here.

FIG. 18 shows an example of boundary condition setting step of the progress management information generated by the progress management information generation section 22 of the management apparatus 20.

In FIG. 18, the numerical value "0.5" on the right side of the item of "boundary condition setting" represents the man-hour of the boundary condition setting step, and "0.5" indicates thirty minutes. The boundary condition setting step includes four sub-steps, namely, a loading point setting step, a load value setting step, a pressure surface setting step, and a pressure value setting step. A man-hour of the boundary condition setting step (0.5) is distributed to these sub-steps. The terminal apparatus 10 that sets the boundary condition transmits task status information to the management apparatus 20 at the predetermined start and end timings of each step in accordance with the boundary condition setting step (the loading point setting step, load value setting step, pressure surface setting step, and pressure value setting step), which is a progress confirmation step of the progress management information.

FIG. 19 is a diagram for specifically explaining the process for transmitting the task status information at this time. In the following explanation, a transmission process between one terminal apparatus 10A and the management apparatus 20 is taken as an example.

After materials setting is ended in compliance with the prescribed man-hour, the boundary condition setting is started. At this time, the date and time is assumed to be "2004/07/01/10:00".

(1) Start of Boundary Condition Setting

When the boundary condition setting task is started, the terminal apparatus 10A records and stores various pieces of information such as model A analysis, operator's information, boundary condition setting start time (10:00), estimated man-hour (0.5), scheduled end time (10:30), and the number of sub-steps (4) in a predetermined region of the progress management information storing section 9 for example, and also transmits the information to the management apparatus 20. The progress state information aggregation section 25 of the management apparatus 20 stores these pieces of information in the progress state information storing section 24 in association with the terminal apparatus 10A.

(2) Start of Loading Point Setting

When the loading point setting step is started, the terminal apparatus 10A records and stores various pieces of information such as model A analysis, operator's information, loading point setting start time (10:00), estimated man-hour (0.25), scheduled end time (10:15), and step completion degree (0) in a predetermined region of the progress management information storing section 9 for example, and also transmits the information to the management apparatus 20. The progress state information aggregation section 25 of the management apparatus 20 stores these pieces of information in the progress state information storing section 24 in association with the terminal apparatus 10A.

(3) End of Loading Point Setting

When the loading point setting step is ended, the terminal apparatus 10A records and stores various pieces of information such as model A analysis, operator's information, loading point setting end time (10:18), estimated man-hour (0.25), scheduled end time (10:15), difference from the estimated man-hour (0.05), and step completion degree (0.5) in a predetermined region of the progress management information storing section 9 for example, and also transmits the information to the management apparatus 20. The progress state information aggregation section 25 of the management apparatus 20 stores these pieces of information in the progress state information storing section 24 in association with the terminal apparatus 10A. In this example, the loading point setting actually took 18 minutes while its estimated required time is 15 minutes, exceeding the estimated man-hour by 3 minutes. As a result, the difference from the estimated man-hour is "0.05 (=3 minutes)".

(4) Start of Load Value Setting

When the load value setting step is started, the terminal apparatus 10A records and stores various pieces of information such as model A analysis, operator's information, load value setting start time (10:18), estimated man-hour (0.15), scheduled end time (10:27), and step completion degree (0.5) in a predetermined region of the progress management information storing section 9 for example, and also transmits the information to the management apparatus 20. The progress state information aggregation section 25 of the management apparatus 20 stores these pieces of information in the progress state information storing section 24 in association with the terminal apparatus 10A.

(5) End of Load Value Setting

When the load value setting step is ended, the terminal apparatus 10A records and stores various pieces of information such as model A analysis, operator's information, loading point setting end time (10:24), estimated man-hour (0.15), scheduled end time (10:27), difference from the estimated man-hour (0.00), and step completion degree (0.8) in a predetermined region of the progress management information storing section 9 for example, and also transmits the information to the management apparatus 20. The progress state information aggregation section 25 of the management apparatus 20 stores these pieces of information in the progress state information storing section 24 in association with the terminal apparatus 10A. In this example, the load value setting actually took 6 minutes while its estimated required time is 9 minutes. The step ended earlier than the scheduled end time by 3 minutes, which compensated 3 minutes by which the estimated man-hour had been exceeded in the loading point setting step. As a result, the difference from the estimated man-hour is "0.00 (=0 minute)".

(6) Start of Pressure Surface Setting

When the pressure surface setting step is started, the terminal apparatus 10A records and stores various pieces of information such as model A analysis, operator's information, pressure surface setting start time (10:24), estimated man-hour (0.05), scheduled end time (10:27), and step completion degree (0.8) in a predetermined region of the progress management information storing section 9 for example, and also transmits the information to the management apparatus 20. The progress state information aggregation section 25 of the management apparatus 20 stores these pieces of information in the progress state information storing section 24 in association with the terminal apparatus 10A.

(7) End of Pressure Surface Setting

When the pressure surface setting step is ended, the terminal apparatus 10A records and stores various pieces of information such as model A analysis, operator's information, pressure surface setting end time (10:27), estimated man-hour (0.05), scheduled end time (10:27), difference from the estimated man-hour (0.00), and step completion degree (0.9) in a predetermined region of the progress management information storing section 9 for example, and also transmits the information to the management apparatus 20. The progress state information aggregation section 25 of the management apparatus 20 stores these pieces of information in the progress state information storing section 24 in association with the terminal apparatus 10A. In this example, the estimated required time for the pressure surface setting is 3 minutes and the pressure surface setting actually took 3 minutes. As a result, the difference from the estimated man-hour is "0.00 (=0 minute)".

(8) Start of Pressure Value Setting

When the pressure value setting step is started, the terminal apparatus 10A records and stores various pieces of information such as model A analysis, operator's information, pressure value setting start time (10:27), estimated man-hour (0.05), scheduled end time (10:30), and step completion degree (0.9) in a predetermined region of the progress management information storing section 9 for example, and also transmits the information to the management apparatus 20. The progress state information aggregation section 25 of the management apparatus 20 stores these pieces of information in the progress state information storing section 24 in association with the terminal apparatus 10A.

(9) End of Pressure Value Setting

When the pressure value setting step is ended, the terminal apparatus 10A records and stores various pieces of information such as model A analysis, operator's information, load value setting end time (10:29), estimated man-hour (0.05), scheduled end time (10:30), difference from the estimated man-hour (−0.016), and step completion degree (1) in a predetermined region of the progress management information storing section 9 for example, and also transmits the information to the management apparatus 20. The progress state information aggregation section 25 of the management apparatus 20 stores these pieces of information in the progress state information storing section 24 in association with the terminal apparatus 10A. In this example, the pressure value setting actually took 2 minutes while its estimated required time is 3 minutes. The step ended earlier than the scheduled end time by one minute. As a result, the difference from the estimated man-hour is "−0.016 (=−1 minute)".

As a result of the management apparatus 20 receiving such information from the terminal apparatus 10A as appropriate, it becomes possible to manage the man-hour of the boundary condition setting step, namely, the man-hour of the further divided four sub-steps. The boundary condition setting step shown here is an example, and similar information is transmitted to the management apparatus 20 in other steps as well. Therefore, the management apparatus 20 can totally and uniformly manage the progress of the overall CAE analysis. In other words, the management apparatus 20 can manage progress state of CAE analysis tasks performed on the terminal apparatus 10, specifically, for example, to which step a task has proceeded, or the man-hour required to finish that task.

INDUSTRIAL APPLICABILITY

The present invention is applicable in the fields of computer simulation which can be used for evaluating product quality such as strength or rigidity of products, and computer simulation which aids design for improvement of product quality.

The invention claimed is:

1. A Computer Aided Engineering (CAE) analysis progress management system wherein a terminal apparatus storing an analysis procedure of CAE analysis as a program is connected to a management apparatus managing a state of progress of CAE analysis via a communication network, wherein progress management information in which an analysis task of CAE analysis is divided into a plurality of steps is generated, the terminal apparatus transmits to the management apparatus progress state information of analysis task of each step at a predetermined timing in accordance with the generated progress management information, and the management apparatus uniformly manages progress state of analysis task by aggregating the progress state information transmitted from the terminal apparatus, wherein the management apparatus comprises a control section, a progress management information generation section, a progress confirmation information storing section, a progress state information storing section, and a progress state information aggregation section, and the terminal apparatus comprises a display section, an entry section, a screen display program storing section, an analysis know-how storing section, an analysis calculation processing section, a progress management information storing section, a prepost, and an interactive control section, wherein the terminal apparatus and the management apparatus each include a network interface for reciprocally connecting to one another, wherein the terminal apparatus requires user input via the entry section to perform the analysis task, and wherein processing/control and controlling functions are performed in each of the management apparatus and the terminal apparatus, wherein the terminal apparatus includes an interactive control section which allows for the terminal apparatus to perform the analysis procedure of CAE analysis via the communication network and the network interface, based on inputs obtained through the entry sections of the terminal apparatus, and have a support function to reciprocally support the analysis task.

2. A CAE analysis progress management system wherein a plurality of terminal apparatuses storing an analysis procedure of CAE analysis as a program are connected to a management apparatus managing a state of progress of CAE analysis via a communication network,
  wherein the terminal apparatuses perform an analysis task of CAE analysis with respect to a single analysis object in association with each other via the communication network, in accordance with separate entries through the terminal apparatuses,
  the management apparatus generates progress management information in which an analysis task of CAE analysis is divided into a plurality of steps and transmits the progress management information to each terminal apparatus,
  each terminal apparatus transmits to the management apparatus progress state information of analysis task for one or a plurality of steps allocated to the terminal apparatus at a predetermined timing in accordance with the received progress management information, and
  the management apparatus uniformly manages progress state of CAE analysis task performed by the terminal apparatuses in association with each other by aggregating the progress state information transmitted from the terminal apparatuses,
  wherein the management apparatus comprises a control section, a progress management information generation section, a progress confirmation information storing section, a progress state information storing section, and a progress state information aggregation section, and
  the terminal apparatus comprises a display section, an entry section, a screen display program storing section, an analysis know-how storing section, an analysis calculation processing section, a progress management information storing section, a prepost, and an interactive control section,
  wherein the terminal apparatus and the management apparatus each include a network interface for reciprocally connecting to one another,
  wherein the terminal apparatus requires user input via the entry section to perform the analysis task,
  wherein processing and controlling functions are performed in each of the management apparatus and the terminal apparatus, and
  wherein each terminal apparatus includes an interactive control section which allows for the terminal apparatuses to perform the analysis procedure of CAE analysis simultaneously and in association with each other via the communication network and the network interface, with respect to a single analysis object, based on inputs separately obtained through the entry sections of the respective terminal apparatuses, and have a support function to reciprocally support the analysis task.

3. The CAE analysis progress management system according to claim 1 or 2,
  wherein the progress management information contains an estimated man-hour, a progress confirmation step and manager's information for transmitting the progress state information to the management apparatus, and the terminal apparatus transmits the progress state information at a timing determined by the progress confirmation step.

4. The CAE analysis progress management system according to claim 1 or 2, wherein the terminal apparatus records task status in accordance with the progress management information after an analysis task is started.

* * * * *